United States Patent [19]
Mitsumoto

[11] Patent Number: 5,442,257
[45] Date of Patent: Aug. 15, 1995

[54] SYSTEM FOR AND METHOD OF LIGHTING DISCHARGE LAMP HAVING FAILURE DETECTION OF DISCHARGE LAMP, EXTERNAL WIRING AND LIGHTING CIRCUIT

[75] Inventor: Yoshihiro Mitsumoto, Atsugi, Japan

[73] Assignee: Nissan Motor Co., Ltd., Yokohama, Japan

[21] Appl. No.: 123,178

[22] Filed: Sep. 20, 1993

[30] Foreign Application Priority Data

Sep. 21, 1992 [JP] Japan ................................ 4-250301
Mar. 4, 1993 [JP] Japan ................................ 5-43699

[51] Int. Cl.⁶ .................................................. H01J 1/60
[52] U.S. Cl. ................................... 315/129; 315/133; 340/641; 340/642
[58] Field of Search ......... 315/129, 133, 136, DIG. 7; 340/641, 642, 652

[56] References Cited

U.S. PATENT DOCUMENTS

| | | | |
|---|---|---|---|
| 3,735,378 | 5/1973 | McNamee | 315/129 |
| 4,035,603 | 7/1977 | Fernicola | 313/133 |
| 4,713,584 | 12/1987 | Jean | 340/642 |
| 5,034,659 | 7/1991 | Taniguchi | 340/642 |

FOREIGN PATENT DOCUMENTS

| | | | |
|---|---|---|---|
| 0002195 | 1/1977 | Japan | 315/129 |
| 2-54657 | of 1990 | Japan . | |
| 3-1847 | of 1991 | Japan . | |
| 3-118595 | of 1991 | Japan . | |
| 3-179694 | of 1991 | Japan . | |
| 3171594 | 7/1991 | Japan | 315/129 |
| 2229873A | 10/1990 | United Kingdom . | |
| 2251993A | 7/1992 | United Kingdom . | |

Primary Examiner—Robert J. Pascal
Assistant Examiner—Darius Gambino
Attorney, Agent, or Firm—Lowe, Price, LeBlanc & Becker

[57] ABSTRACT

A discharge lamp lighting device comprises a failure diagnostic circuit for diagnosing failure of a discharge lamp and a lighting circuit. The failure diagnostic circuit diagnoses failure of the discharge lamp and an external wiring from the lighting circuit to the discharge lamp, and diagnoses the lighting circuit if failure of the discharge lamp and the external wiring fails to be found.

8 Claims, 17 Drawing Sheets

5,442,257

SYSTEM FOR AND METHOD OF LIGHTING DISCHARGE LAMP HAVING FAILURE DETECTION OF DISCHARGE LAMP, EXTERNAL WIRING AND LIGHTING CIRCUIT

BACKGROUND OF THE INVENTION

The present invention relates generally to a discharge lamp lighting device and more particularly, to a discharge lamp lighting device provided with a failure diagnostic circuit for diagnosing failure of a discharge lamp and a lighting circuit.

There is known a discharge lamp lighting device constructed so that when a discharge lamp cannot be started within a predetermined period of time, it is judged that lighting thereof is impossible, stopping power supply to the discharge lamp (see, for example, JP-U 3-118595).

FIG. 11 shows a constitution of a discharge lamp lighting device of this type. With a light switch 2 turned on, a step-up circuit 1 increases voltage of a battery 3 to output high DC voltage. An inverter 4 converts DC voltage output from the step-up circuit 1 into AC voltage which is applied to a discharge lamp 5 for lighting same. A starter circuit 6 generates high voltage pulses during a predetermined period of time after turning on the light switch 2, which is applied to the discharge lamp 5 for starting same. When supplying power of the battery 3 through the light switch 2, a control circuit 7 controls the step-up circuit 1, the inverter 4, and the starter circuit 6 so as to carry out lighting control of the discharge lamp 5.

FIG. 12 shows details of an external wiring from the lighting circuit to the discharge lamp and the discharge lamp. A discharge lamp lighting device 10 comprising the step-up circuit 1, the inverter 2, the starter circuit 6, and the control circuit 7 is connected to the discharge lamp 5 through a high voltage cable 8a, a connector 9, and a high voltage cable 8b. The discharge lamp 5 includes an outer tube 5a having a discharge lamp bulb 5b mounted therein.

FIG. 13 is a flowchart showing operation of the known discharge lamp lighting device.

At a step S1, it is determined whether or not the light switch 2 is turned on. If the light switch 2 is turned on, the flow proceeds to a step S2 wherein the step-up circuit 1, the inverter 4, and the starter circuit 6 are actuated to start the discharge lamp 5. At a subsequent step S3, it is determined whether or not the discharge lamp 5 is turned on. If the discharge lamp 5 is turned on, the flow proceeds to a step S4, whereas if not, the flow proceeds to a step S7. At the step S4, the step-up circuit 1 and the inverter 4 are controlled to obtain stable lighting of the discharge lamp 5. Subsequently, at a step S5, it is determined whether or not the light switch 2 is turned off. If the light switch 2 is turned off, the flow proceeds to a step S6, whereas if not, the flow returns to the step S4. At the step S6, operation of the step-up circuit 1 and the inverter 4 is stopped to turn off the discharge lamp 5.

At the step S3, if the discharge lamp 5 is not turned on, the flow proceeds to the step S7 wherein it is determined whether or not a predetermined period of time elapses. If the predetermined period of time elapses, the flow proceeds to a step S8, whereas if not, the flow returns to the step S2. At the step S8, operation of the step-up circuit 1, the inverter 4, and the starter circuit 6 is stopped, then the flow proceeds to a step S9. At the step S9, it is determined whether or not the light switch 2 is turned off. If the light switch 2 is turned off, lighting control of the discharge lamp 5 is finished.

In addition, there are known a lighting device so constructed as to turn off the discharge lamp by detecting breakage of a lens thereof (see, for example, JP-U 2-54657), a lighting device so constructed as to stop power supply thereto if the connector is disconnected (see, for example, JP-U 1847), a lighting device so constructed as to stop power supply thereto if anomaly of output voltage, output current, or the like of the circuit is detected (see, for example, JP-A 3-179694), etc.

With the known discharge lamp lighting devices, however, if the discharge lamp is not turned on, starting operation is repeatedly carried out by applying high voltage pulses during a predetermined period of time. Thus, when lighting of the discharge lamp is not possible due to a presence of some failure of the discharge lamp itself or the lighting device, starting operation coercively repeated may produce even breakage of a normal circuit or device.

Moreover, anomaly of output voltage or output current of the circuit cannot be detected without actually operating the lighting device. However, with a presence of failure of the discharge lamp itself or the external wiring from the lighting device to the discharge lamp, operation of the discharge lamp may produce breakage of a normal circuit or device.

It is, therefore, an object of the present invention to provide a system for and a method of lighting a discharge lamp which enables detection of a circuit or device as malfunctioned without any breakage of a normal circuit or device.

SUMMARY OF THE INVENTION

According to one aspect of the present invention, there is provided a system for lighting a discharge lamp with a bulb, the discharge lamp being connected to a power source, comprising:

a lighting circuit means for lighting the discharge lamp, said lighting circuit means being connected to the discharge lamp through an external wiring; and a failure diagnostic circuit means, connected to the discharge lamp and said lighting circuit means, for diagnosing a failure of the discharge lamp and said lighting circuit means, said failure diagnostic circuit means diagnosing said failure of the discharge lamp and said external wiring, and said failure diagnostic circuit means diagnosing said lighting circuit means if said failure of the discharge lamp and said external wiring fails to be found.

According to another aspect of the present invention, there is provided a method of lighting a discharge lamp with a bulb, the discharge lamp being connected to a power source, a lighting circuit means for lighting the discharge lamp connected to the discharge lamp through an external wiring, and a failure diagnostic circuit means for diagnosing a failure of the discharge lamp and the lighting circuit means, the method comprising the steps of:

diagnosing the failure of the discharge lamp and the external wiring; and diagnosing the lighting circuit means if the failure of the discharge lamp and the external wiring fails to be found.

DETAILED DESCRIPTION OF THE INVENTION

Figure 1:
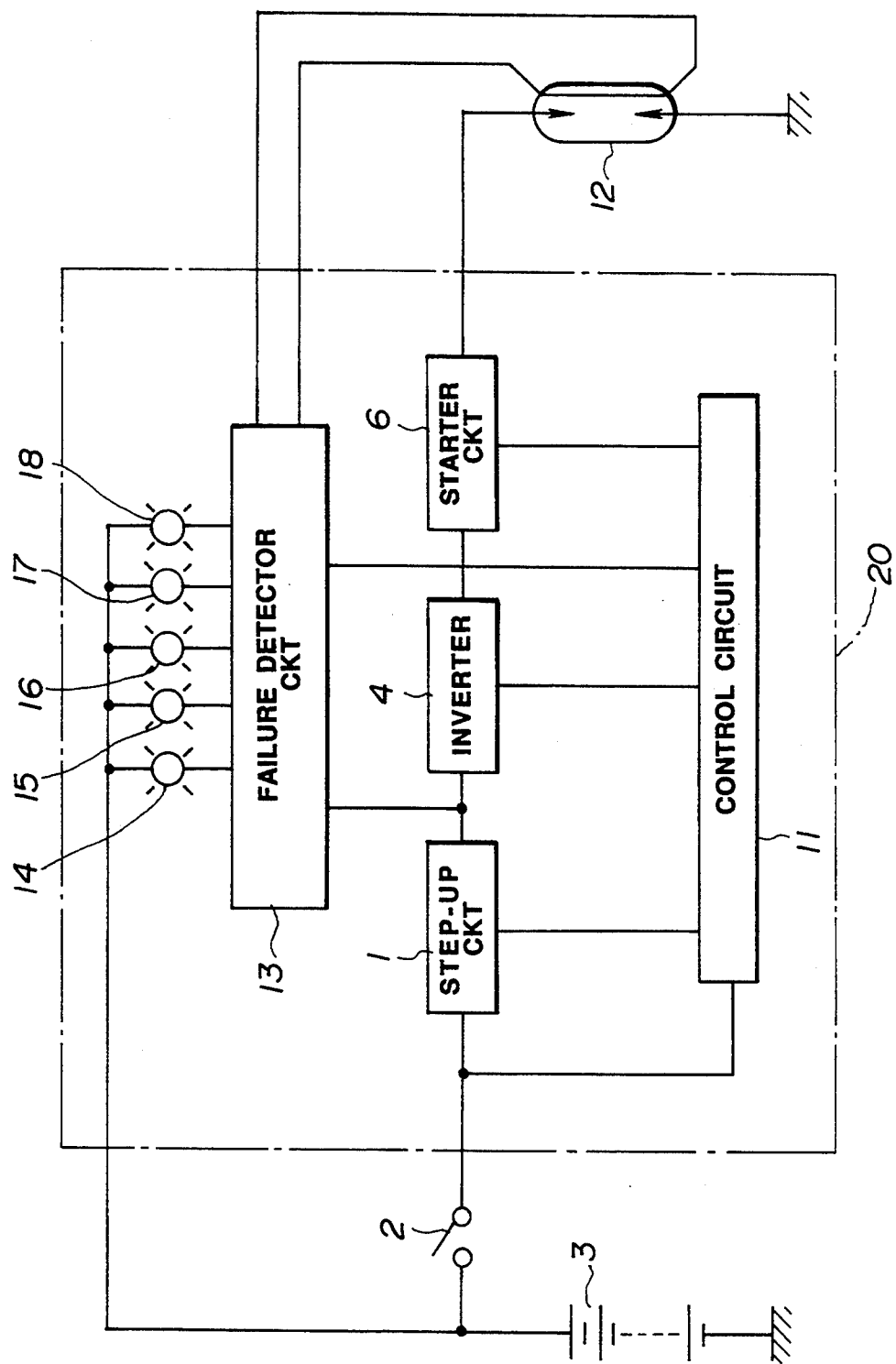
FIG. 1 is a block diagram showing a first preferred embodiment of a discharge lamp lighting device according to the present invention.

Referring to the drawings wherein like reference numerals designate like parts throughout the views, referring first to FIGS. 1 to 10, there is shown a first preferred embodiment of the present invention.

Referring to FIG. 1, when supplying power of a battery 3 through a light switch 2, a control circuit 11 controls a step-up circuit 1, an inverter 4, and a starter circuit 6 to carry out lighting control of a discharge lamp 12, and fulfills failure diagnostic operation for each circuit based on a command signal derived from a failure detector circuit 13. The failure detector circuit 13 detects failure of the step-up circuit 1, the inverter 4, the starter circuit 6, and the discharge lamp 12. If failure is found, the control circuit 6 turns on failure indicator lamps 14 to 17 corresponding to the circuits 1, 4, 6, and the discharge lamp 12. It is to be noted that an indicator lamp 18 serves as an alarm lamp for warning a change of the discharge lamp 12.

Figure 2:
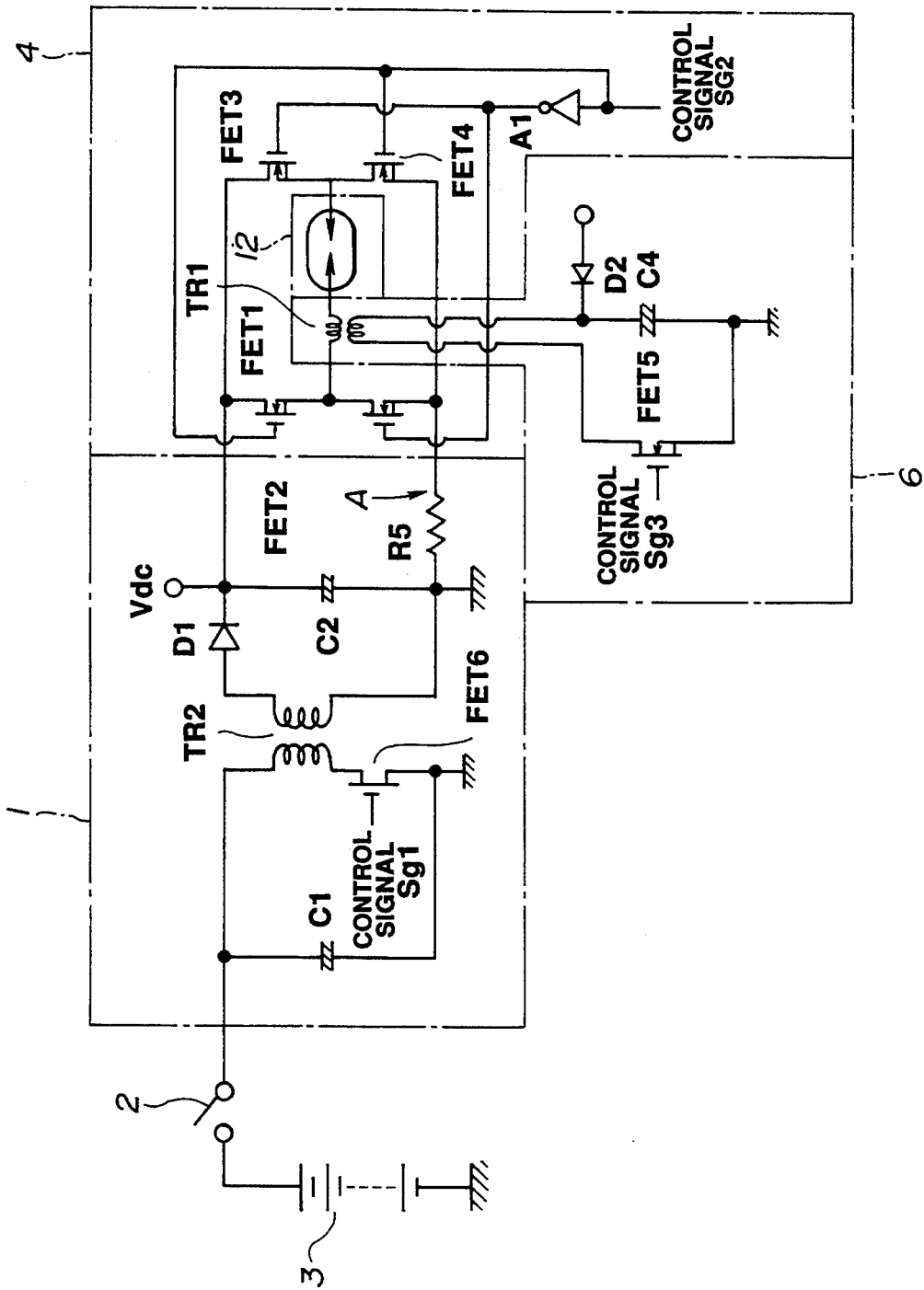
FIG. 2 is a circuit diagram showing a main circuit of the discharge lamp lighting device.

Referring to FIG. 2, an outline of the circuits 1, 4, 6 will be described.

The step-up circuit 1 comprises a well-known chopper circuit, etc., and is constructed to convert DC voltage supplied from the battery 3 into AC voltage once, which is stepped up, then converted again into DC voltage for outputting same. When the control circuit 11 supplies a PWM control signal Sg1 to a gate of an FET 6, electric charge accumulated in a capacitor C1 is discharged through a primary winding of a transformer TR2 and the FET 6, obtaining a passage of AC current having frequency of the PWM control signal Sg1. By this, high AC voltage is induced in a secondary winding of the transformer TR2 in accordance with a winding ratio thereof. This high AC voltage is rectified by a diode D1, then smoothed by a capacitor C2, generating a high DC voltage Vdc.

The inverter 4 comprises four FETs 1 to 4, etc., and is constructed so that the FETs 1, 4, and the FETs 2, 3 are alternately turned on in accordance with a control signal Sg2 derived from the control circuit 11. By this, the polarity of the high DC voltage Vdc applied to the discharge lamp 12 is switched periodically. That is, high AC voltage is applied to the discharge lamp 12.

The starter circuit 6 comprises an FET 5, a capacitor C4, a transformer TR1, etc., and is constructed so that when the control circuit 11 supplies a pulse-train-like control signal Sg3 to a gate of the FET 5, electric charge accumulated in the capacitor C4 through a diode D2 is discharged through a primary winding of the transformer TR1 and the FET 5, obtaining a passage of pulse-train-like primary current. By this, a high voltage pulse train is induced in a secondary winding of the transformer TR1 in accordance with a winding ratio thereof. Such pulse voltage is superimposed on the high DC voltage Vdc, which is applied to the discharge lamp 12 as a starting voltage Vbd.

In this embodiment, a self-diagnosis of the discharge lamp 12 and the lighting device 20 is carried out upon starting in accordance with the following procedure:

1) An outer tube of the discharge lamp 12 is not broken down? Breakage of high voltage cables is not found? Disconnection or imperfect contact of a connector is not found?

2) Short-circuit failure is not found with output of the lighting device 20?

3) The step-up circuit 1 operates normally?

4) The inverter 4 and the starter circuit 6 operate normally?

Such diagnoses are carried out in the failure detector circuit 13 and the control circuit 11. If some failure is detected, the corresponding failure indicator lamp 14 to 18 is turned on.

Among the above diagnostic items, the items 1 and 2 correspond to grave failure which produces even breakage of a normal circuit or device, and enlarges a failure part if the discharge lamp 12 is started. When detecting this grave failure, the diagnoses of the items 3 and 4 are interrupted, and starting of the discharge lamp 12 is prohibited. If a result of the diagnoses of the items 1 and 2 reveals no anomaly, the diagnosis proceeds to the item 3. In the diagnosis of the item 3, it is examined whether or not the output voltage Vdc of the step-up circuit 1 is greater than a specified value. If the output voltage Vdc is greater than the specified value, it is determined that the step-up circuit 1 is normal. However, if the output voltage Vdc is smaller than the specified value, it may be highly due to a decrease in voltage of the battery 3 as described above. Moreover, the diagnoses of the items 1 and 2 reveal that no failure is found with the discharge lamp 12 and the external wiring from the lighting device 20 to the discharge lamp 12. Thus, the discharge lamp 12 is started, and the diagnosis of the next item 4 is carried out. In the diagnosis of the item 4, it is examined whether or not the starting voltage Vbd of the inverter 4 and the starter circuit 6 is greater than a specified value. If the starting voltage Vbd is greater than the specified value, it is determined that the inverter 4 and the starter circuit 6 are normal. However, even if the starting voltage Vbd is smaller than the specified value, it may be due to a decrease in voltage of the battery 3. Moreover, the diagnoses of the items 1 and 2 reveal that no failure is found with the discharge lamp 12 and the external wiring from the lighting device 20 to the discharge lamp 12. Thus, starting operation of the discharge lamp 12 is continued.

First, referring to FIGS. 3a and 3b, diagnostic circuit and procedure of the item 1 will be explained. The discharge lamp 12 includes an outer tube 12a having a discharge lamp bulb 12b mounted therein, and an inner surface on which a conductive line 12c is vapor-deposited. The starter circuit 6 applies drive voltage to the discharge lamp bulb 12b through a high voltage cable 21, a connector 22, and a high voltage cable 23.

The conductive line 12c of the discharge lamp 12 is connected to the failure detector circuit 13 through the high voltage cable 23, the connector 22, and the high voltage cable 21. Signal current passes from a power source Vcc of the failure detector circuit 13 via a course of resistor R2→signal line 21a→connector 22→signal line 23a→conductive line 12c→signal line 23b→connector 22→signal line 21b→resistor R4→base of the transistor T1→emitter of T1→ground, thus turning on the transistor T1 to put a collector potential V1 thereof at a low level. Now, if there is breakage of the conductive line 12c due to the outer tube 12a of the discharge lamp 12 damaged, or breakage of the high voltage cable 21, 23, or disconnection or imperfect contact of the connector 22, the above course becomes unconductive to put signal current zero, or imperfect contact produces an increase in circuit impedance to decrease signal current. As a result, the transistor T1 becomes off or in a state close to off so as to put the collector potential A1 at a high level. If the collector potential V1 is measured which is greater than a preset value, it is judged that failure is found such as breakage of the discharge lamp 12, breakage of the high voltage cables 21, 23, or imperfect contact or disconnection of the connector 22.

With a presence of such grave failure, starting of the lighting device 20 may produce breakage of a normal circuit or device. Thus, when detecting grave failure, operation of the lighting device 20 is prohibited, and the failure indicator lamp 14 is turned on for warning.

Next, referring to FIG. 2, the diagnostic procedure of the item 2 will be explained. The control circuit 11 supplies the fixed control signal Sg2 to the inverter 4 so as to hold either of the FETs 1, 4 and the FETs 2, 3, for example, the FETs 1, 4, in a on-state, and also supplies the PWM control signal Sg1 having low frequency to the step-up circuit 1 so as to output the low DC voltage Vdc. If output of the lighting device 20 such as the bulb 12b of the discharge lamp 12 or the high voltage cable 21, 23 is short-circuited, current passes under the DC output voltage Vdc of the step-up circuit 1 via a course of FET 1→secondary winding of the transformer TR1→ discharge lamp 12→FET 4→resistor R5, thus generating voltage proportional to current passing at one terminal A of the resistor R5. By this, short-circuit failure of output of the lighting device 20 is detected.

With a presence of such grave failure, operation of the lighting device 20 may produce breakage of a normal circuit or device. Thus, when detecting grave failure, operation of the lighting device 20 is prohibited, and the failure indicator lamp 15 is turned on for warning.

Referring also to FIG. 2, the diagnostic procedure of the item 3 will be explained. Since a result of the diagnosis of the item 2 confirms that output of the lighting device 20 is not short-circuited, the control circuit 11 supplies the ordinary PWM control signal Sg1 to the step-up circuit 1 so as to actuate the step-up circuit 1, and it is examined whether or not the DC output voltage Vdc is greater than the specified value. If the DC output voltage Vdc is greater than the specified value, it is judged that the step-up circuit 1 operates normally.

As described above, even if the output voltage Vc is smaller than the specified value, it is highly due to a decrease in voltage of the battery 3. Moreover, the diagnoses of the items 1 and 2 reveal that no failure is found with the discharge lamp 12 and the external wiring. Thus, the diagnosis of the next item 4 is carried out.

Figure 4:
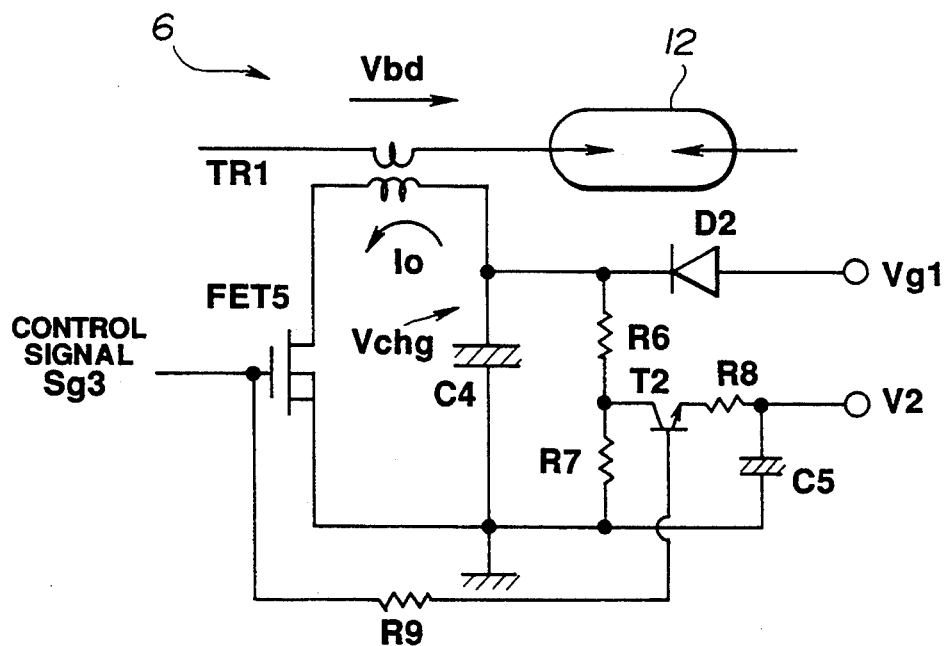
FIG. 4 is a view similar to FIG. 2, showing a starter circuit.
Figure 5:
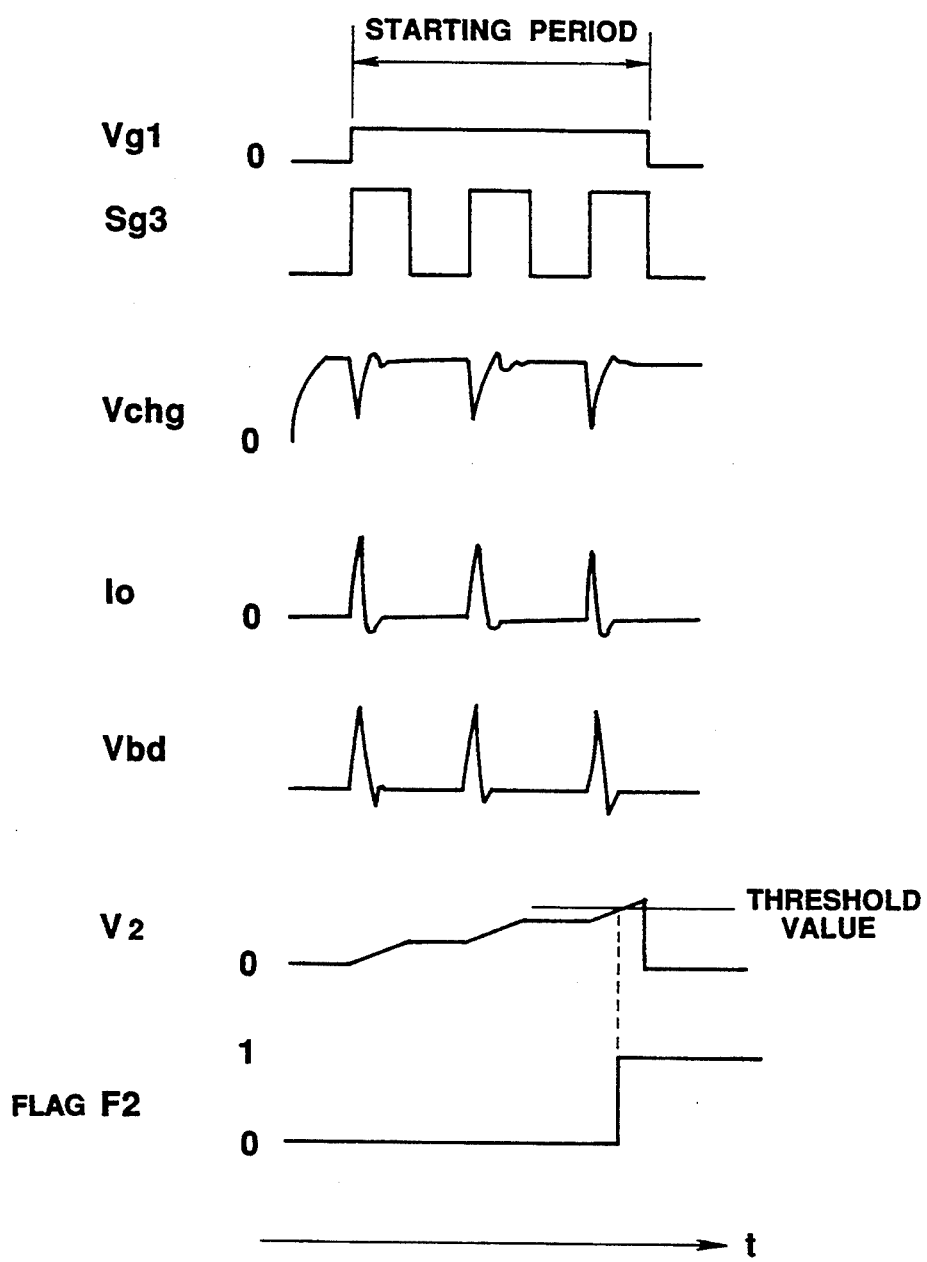
FIG. 5 is a time chart showing variations of voltage and current of parts of the starter circuit as shown in FIG. 4.

Finally, the diagnostic procedure of the item 4 will be explained. As described above, if the starting voltage Vbd is greater than the specified value, it is Judged that the inverter 4 and the starter circuit 6 are normal. However, in this embodiment, the inverter 4 and the starter circuit 6 are diagnosed in the following method since the starting voltage Vbd is difficult to measure due to a high value of, for example, 10 kV to 20 kV, and an addition of a circuit for measuring such high voltage may have a harmful influence on a load:

Referring to FIGS. 4 and 5, as described above, the starter circuit 6 generates pulse-train-like current in the primary winding circuit of the transformer TR1, and introduces pulse-train-like voltage on the secondary side of the transformer TR1, which is superimposed on the DC voltage Vdc, thus generating the starting voltage Vbd. Therefore, if pulse-train-like current having a specified value passes in the primary winding circuit of the transformer TR1, it can be estimated that the starting voltage Vbd is greater than the specified value.

During a starting period of the discharge lamp 12, the power source (not shown) applies a voltage Vg1 to the capacitor C4 of the starter circuit 6 through the diode D2 for charging same. The control circuit 11 supplies the pulse-train-like control signal Sg3 to the gate of the FET 5. Whenever the FET 5 is on, an electric charge accumulated in the capacitor C4 is discharged, so that a current Io passes in the primary winding of the transformer TR1 at a period of the pulse-train-like signal, and high pulse voltage, i.e., the starting voltage Vbd, is generated in the secondary winding of the transformer TR1 at the same period. This starting voltage Vbd is proportional to the primary winding current Io of the transformer TR1, and has a higher value as the current Io becomes greater. Additionally, the primary winding current Io is proportional to a terminal voltage Vchg of the capacitor C4, and has a greater value as the terminal voltage Vchg becomes higher. That is, since the starting voltage Vbd is proportional to the terminal voltage Vchg of the capacitor C4, the starting voltage Vbd can be estimated by detecting the terminal voltage Vchg.

The control circuit 11 also supplies the pulse-train-like control signal Sg3 to a base of the transistor T2 through a resistor R9, so that the transistor T2 is on at a period of the pulse-train-like signal. Voltage obtained by dividing the terminal voltage Vchg of the capacitor C4 between the resistors R6 and R7 is applied to a collector of the transistor T2. Whenever the transistor T2 is on, this divided voltage is applied to the capacitor C5 through a resistor R8 for charging same. As a result, a terminal voltage V2 of the capacitor C5 increases at a period of the pulse-train-like signal, and augments more quickly as the terminal voltage Vchg of the capacitor C4 becomes higher. In this embodiment, the control circuit 11 supplies three pulse control signals Sg3. The terminal voltage V2 is detected immediately after occurrence of three starting voltage pulses Vbd. If the voltage V2 is greater than a predetermined threshold value, it is judged that the normal starting voltage Vbd is applied to the discharge lamp 12, and the inverter 4 and the starting circuit 6 operate normally.

Figure 6:
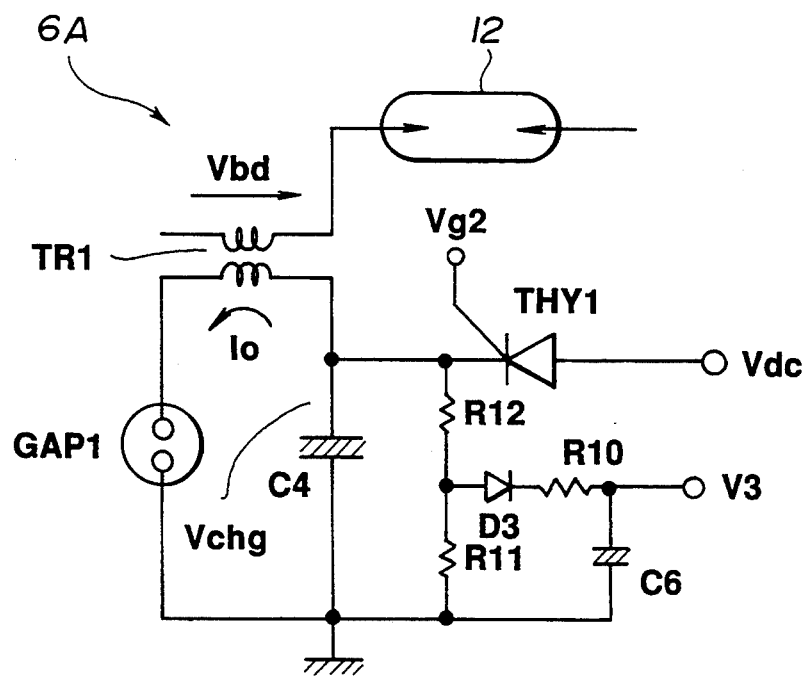
FIG. 6 is a view similar to FIG. 4, showing a variant of the starter circuit.
Figure 7:
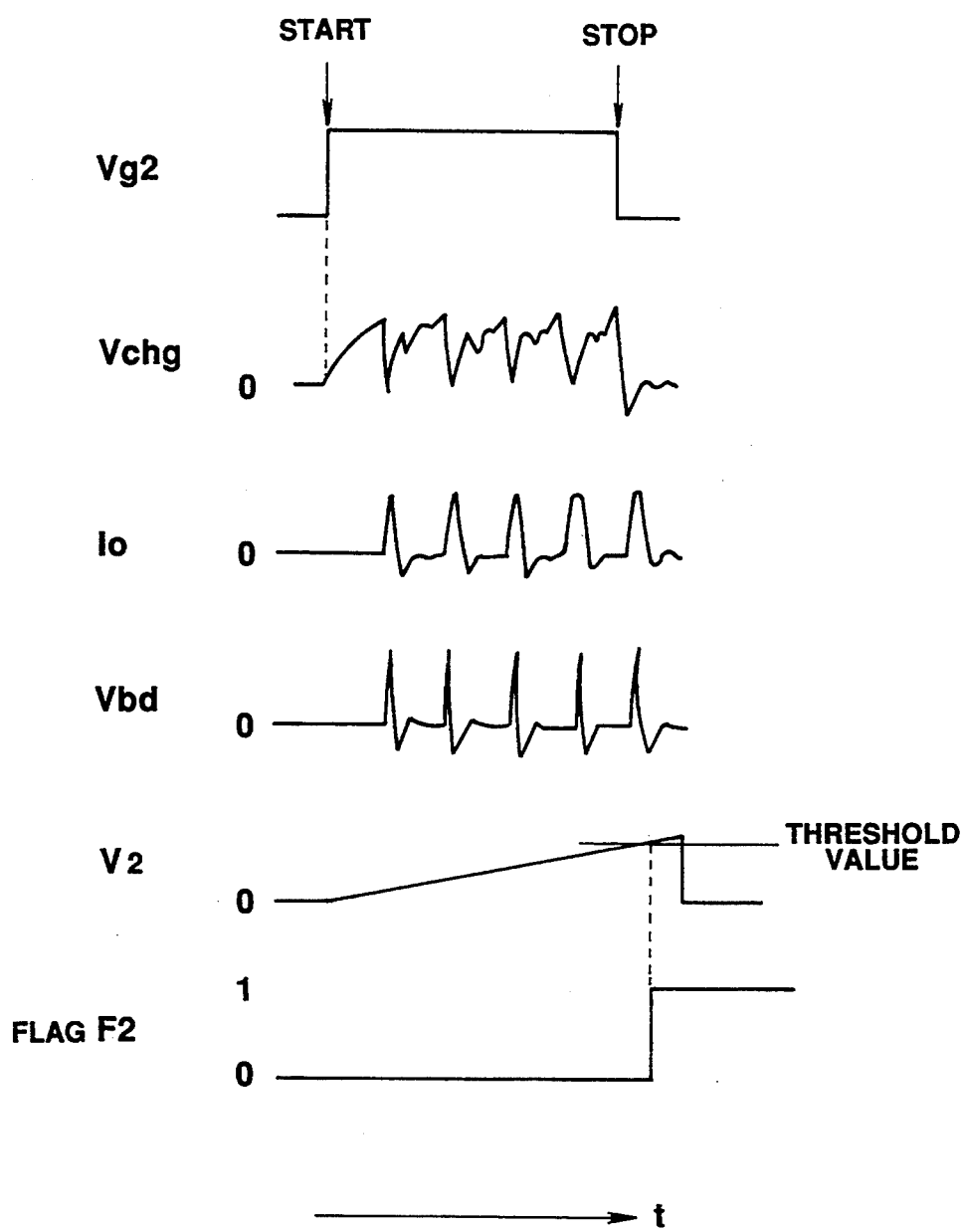
FIG. 7 is a view similar to FIG. 5, showing variations of voltage and current of parts of the starter circuit as shown in FIG. 6.

Referring to FIGS. 6 and 7, in a starter circuit 6A as a variant of the starter circuit 6, a discharge gap GAP1 is used instead of the FET 5. The discharge gap GAP1 carries out a discharge when voltage across both ends thereof reaches a predetermined value. During a starting period, if a gate signal Vg2 is applied to a gate of a thyristor THY1 so as to turn on the thyristor TYH1, and the DC voltage Vdc of the step-up circuit 1 is applied to the capacitor C4 through the thyristor THY1 for charging same, the terminal voltage Vchg of the capacitor C4 increases. When this terminal voltage Vchg reaches discharge voltage of the discharge gap GAP1, a discharge occurs at the discharge gap GAP1, and an electric charge accumulated in the capacitor C4 is discharged, so that the current Io passes in the primary winding circuit of the transformer TR1, generating the starting voltage Vbd on the secondary side of the transformer TR1. If the discharge gap GAP1 carries out a discharge, and the current Io passes in the primary winding circuit of the transformer TR1, the terminal voltage Vchg of the capacitor C4 decreases, and a discharge of the discharge gap GAP1 stops, putting also the primary winding current Io zero. Subsequently, the capacitor C4 is charged again, and the above-mentioned operation is repeatedly carried out.

As described above, since the starting voltage Vbd is proportional to the terminal voltage Vchg of the capacitor C4, this terminal voltage Vchg is divided between the resistors R11 and R12 for measuring the terminal voltage Vchg of the capacitor C4, charging the capacitor C6 through a diode D3 and a resistor R10. The higher the terminal voltage Vchg of the capacitor C4 is, the more quickly a terminal voltage V3 of the capacitor C6 increases. If this terminal voltage V3 reaches a predetermined threshold value within a predetermined period of time after starting, it is judged that the starting voltage Vbd sufficient to start the discharge lamp 12 is applied, and the inverter 4 and the starter circuit 6 are normal.

Figure 8:
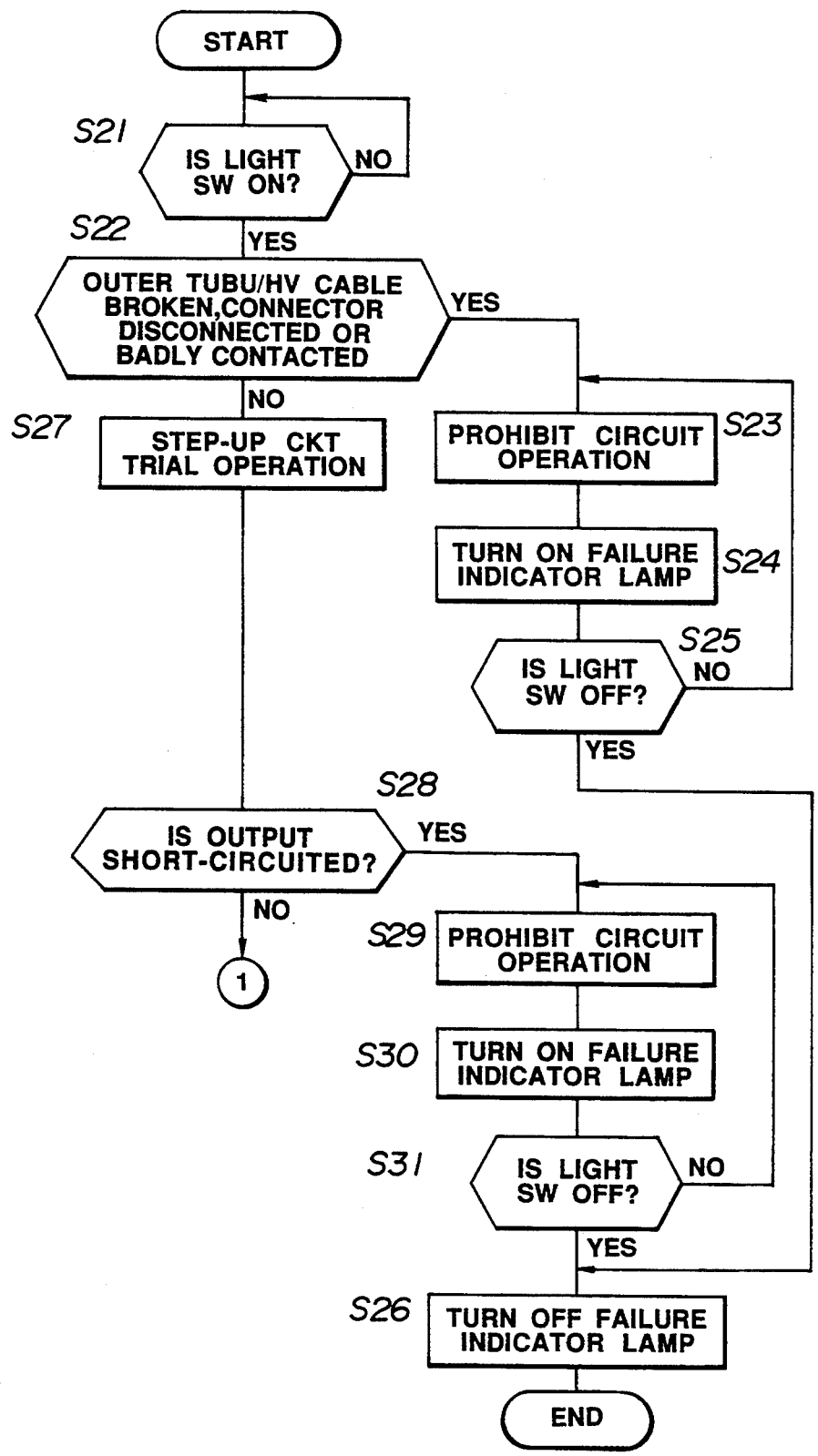
FIG. 8 is a flowchart showing operation of the first preferred embodiment.
Figure 9:
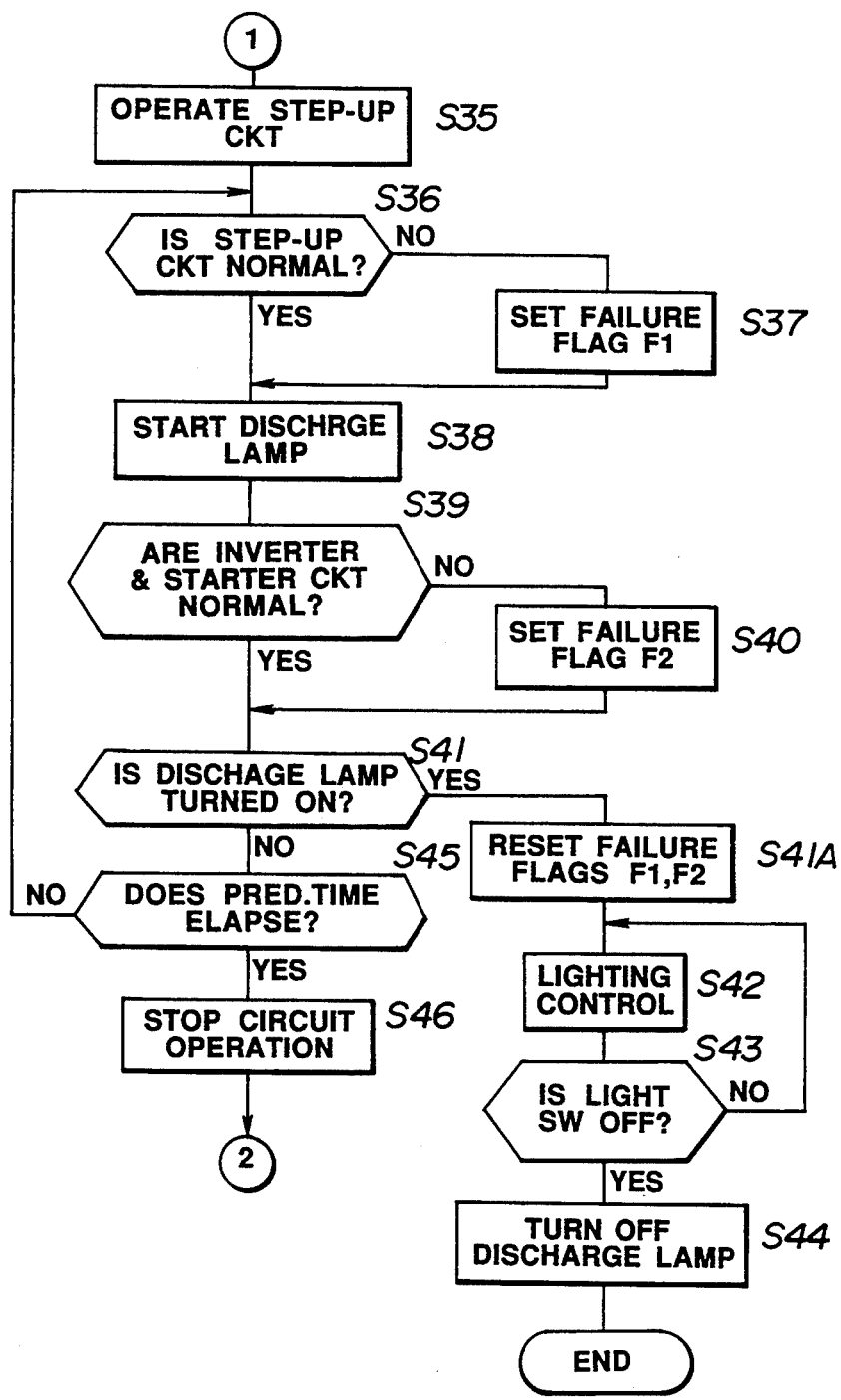
FIG. 9 is a view similar to FIG. 8, showing operation subsequent to FIG. 8.
Figure 10:
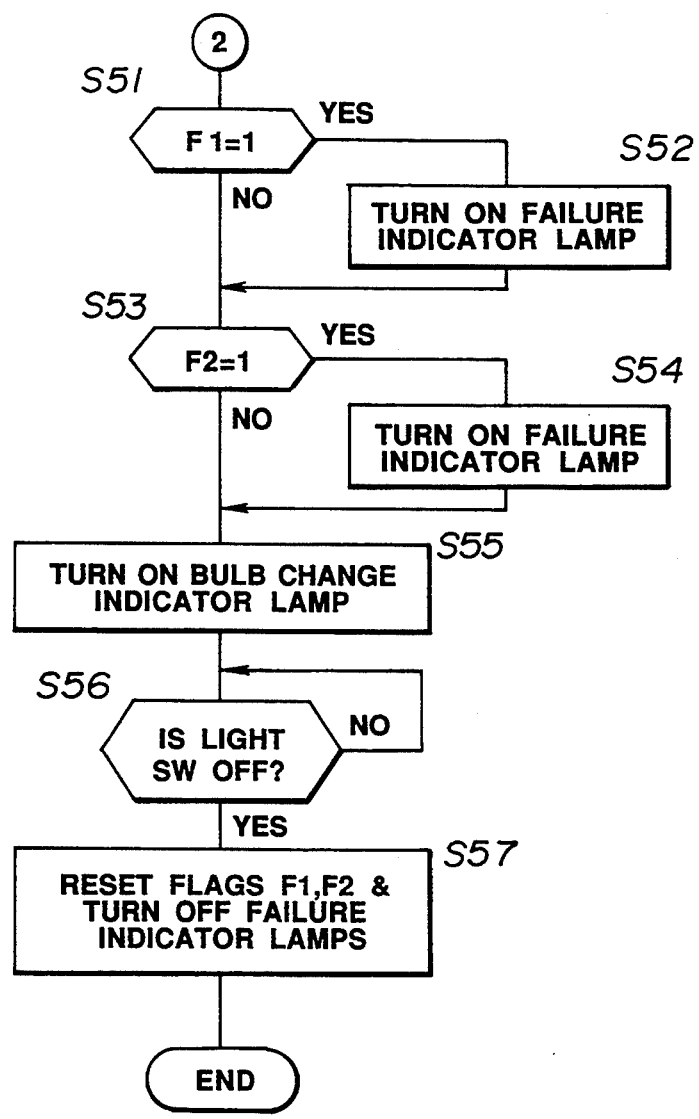
FIG. 10 is a view similar to FIG. 9, showing operation subsequent to FIG. 9.
Figure 11:
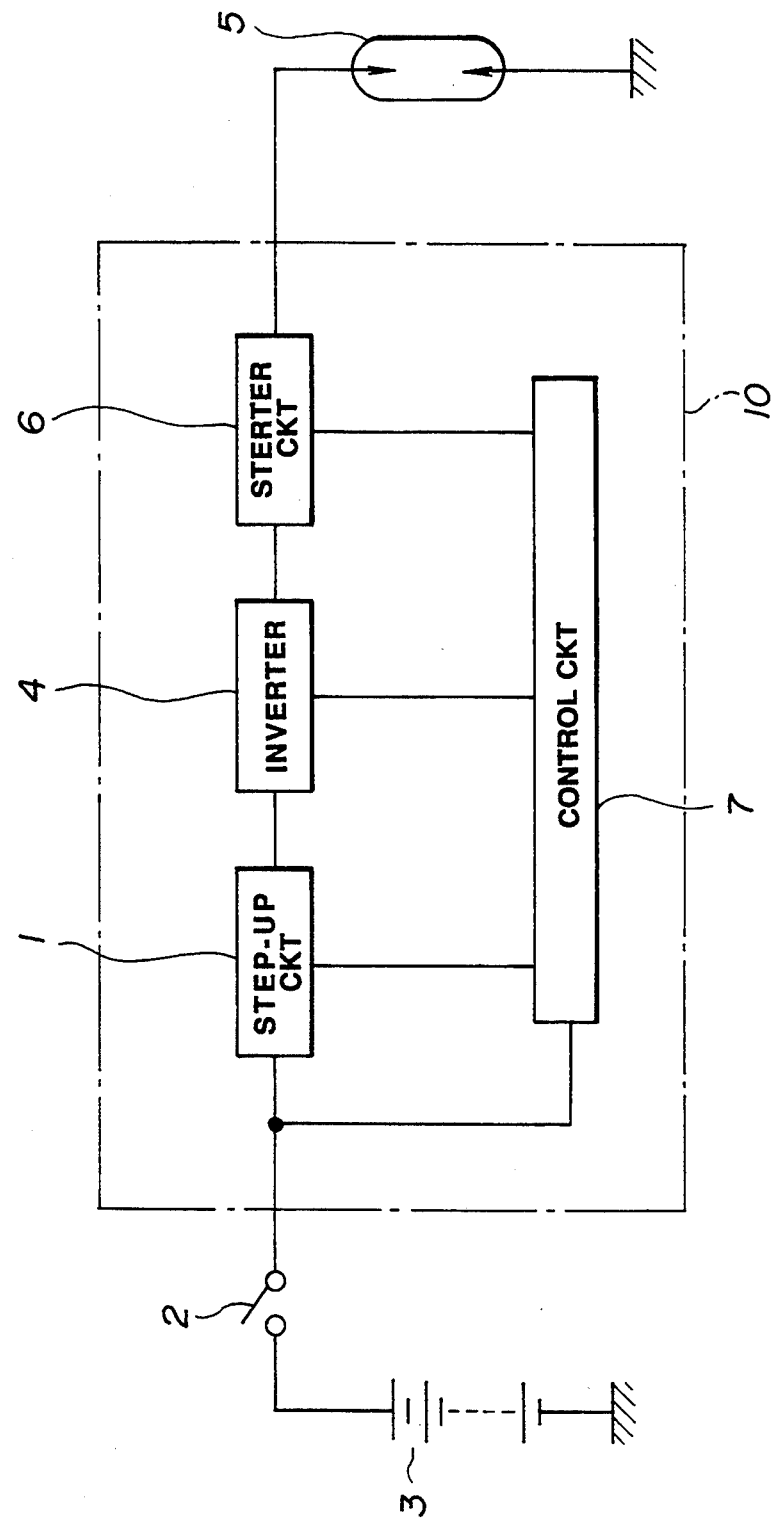
FIG. 11 is a view similar to FIG. 3a, showing a known discharge lamp lighting device.
Figure 12:
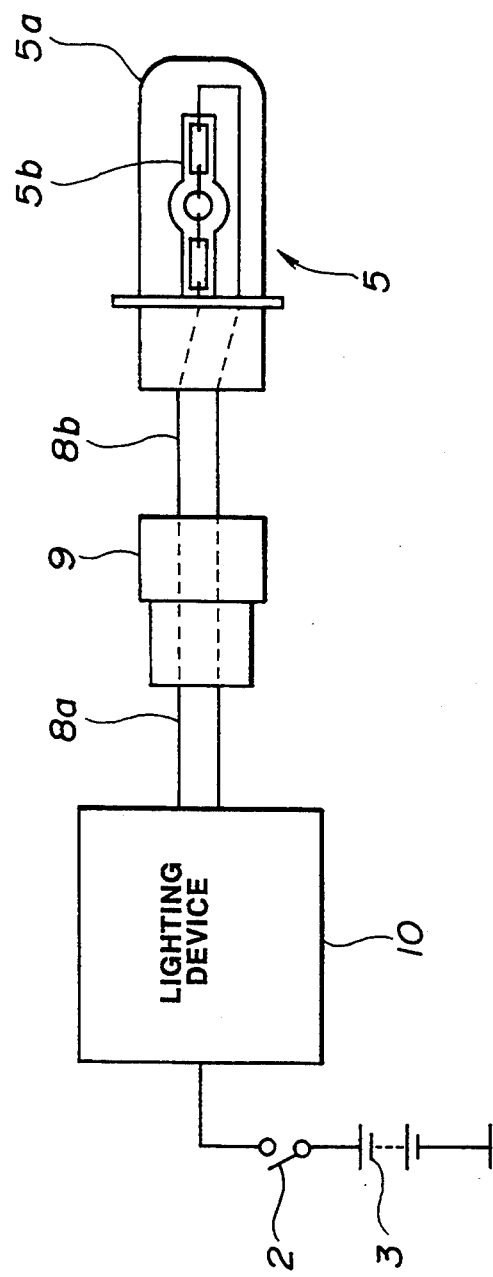
FIG. 12 is a view similar to FIG. 3a, showing the discharge lamp lighting device connected to a discharge lamp through an external wiring.
Figure 13:
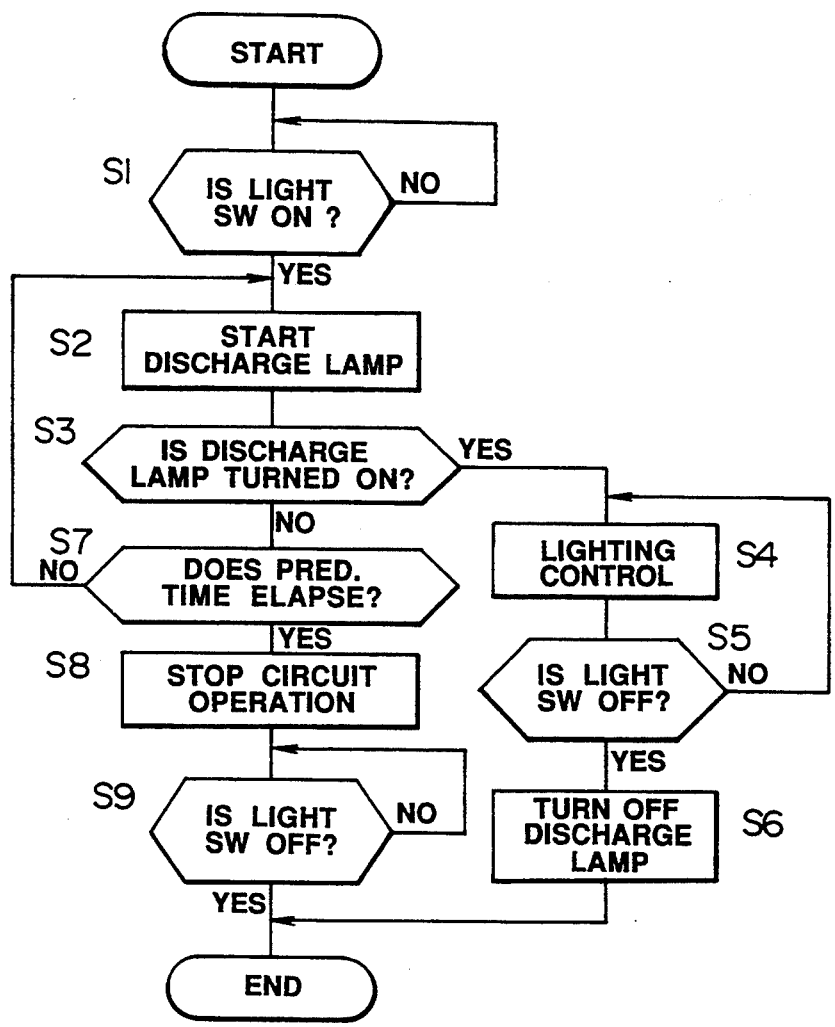
FIG. 13 is a view similar to FIG. 10, showing operation of the known discharge lamp lighting device.

Referring to FIGS. 8 to 10, operation of this embodiment will be explained.

At a step S21, it is determined whether or not the light switch 2 is turned on. If the light switch 2 is turned on, the flow proceeds to a step S22 wherein it is determined by the failure detector circuit 13 whether or not there is breakage of the outer tube 12a of the discharge lamp 12, breakage of the high voltage cables 21, 23, or disconnection or imperfect contact of the connector 22.

Figures 3A, 3B:
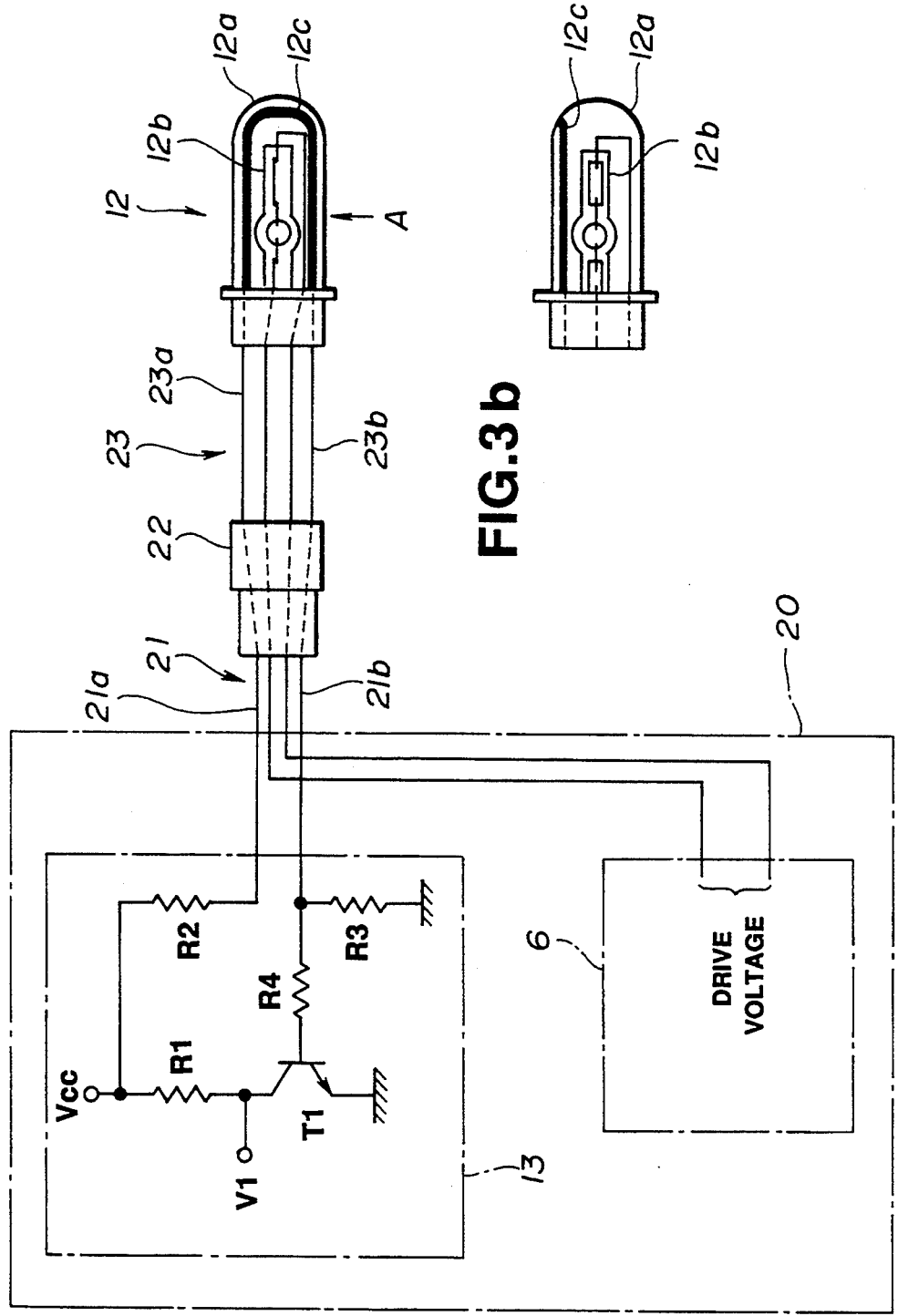
FIG. 3a is a view similar to FIG. 1, showing a part of the discharge lamp lighting device connected to a discharge lamp through an external wiring.
FIG. 3b is a diagrammatic view showing a discharge lamp bulb.

As described above, if the voltage V1 of the failure detector circuit 13 as shown in FIG. 3a exceeds the preset value, it is judged that some failure is found, and the flow proceeds to a step S23, whereas if not, the flow proceeds to a step S27. When such grave failure is detected, operation of the step-up circuit 1, the inverter 4, and the starter circuit 6 is prohibited at the step S23, then the flow proceeds to a step S24 wherein the failure indicator lamp 14 is turned on for warning. Subsequently, at a step S25, it is determined whether or not the light switch 2 is turned off. If the light switch 2 is turned off, the flow proceeds to a step S26, whereas if not, the flow returns to the step S23. At the step S26, the failure indicator lamp 14 is turned off, finishing lighting control of the discharge lamp 12.

If it is determined at the step S22 that no failure is found with the discharge lamp 12 and the external wiring, at the step S27, the control circuit 11 outputs the PWM control signal Sg1 having low frequency to the step-up circuit 1, and the step-up circuit 1 outputs the low DC voltage Vdc for carrying out trial operation. At a subsequent step S28, it is determined whether or not output of the lighting device 20 is short-circuited. As described above, if voltage is generated at the one terminal A of the resistor R5 as shown in FIG. 2, it is judged that a short-circuit is found with output of the lighting device 20, and the flow proceeds to a step S29. Since a short-circuit of output of the lighting device 20 is grave failure, operation of the step-up circuit 1, the inverter 4, and the starter circuit 6 is prohibited at the step S29. At a subsequent step S30, the failure indicator lamp 15 is turned on. Subsequently, at a step S31, it is determined whether or not the light switch 2 is turned off. If the light switch 2 is turned off, the flow proceeds to the step S26, whereas if not, the flow returns to the step S29.

If it is determined at the step S28 that no short-circuit is found with output of the lighting device 20, the flow proceeds to a step S35 as shown in FIG. 9 wherein the control circuit 11 outputs the ordinary PWM signal Sg1 to the step-up circuit 1 so as to make the step-up circuit 1 carry out ordinary step-up operation. At a subsequent step S36, it is determined whether or not the step-up circuit 1 is normal. If the output voltage Vdc of the step-up circuit 1 is greater than the specified value, it is judged that the step-up circuit 1 is normal, and the flow proceeds to a step S38, whereas if not, the flow proceeds to a step S37 wherein a failure flag F1 of the step-up circuit 1 is set.

Even if it is judged that failure is found since the output voltage Vdc of the step-up circuit 1 is smaller than the specified value, it may be due to a decrease in voltage of the battery 3. Moreover, it is confirmed that no anomaly is found with the discharge lamp 12 and the external wiring. Thus, at a step S38, the inverter 4 and the starter circuit 6 are actuated to start the discharge lamp 12. Then, at a step S39, it is determined whether or not the inverter 4 and the starter circuit 6 are normal. As described above, if the terminal voltage V2 of the capacitor C5 of the starter circuit 6 as shown in FIG. 4 exceeds the threshold value, or the terminal voltage V3 of the capacitor C6 of the starter circuit 6A as shown in FIG. 6 exceeds the threshold value, it is judged that the inverter 4 and the starter circuit 6 are normal, and the flow proceeds to a step S41, whereas if not, the flow proceeds to a step S40. At the step S40, a failure flag F2 of the inverter 4 and the starter circuit 6 is set.

At the step S41, it is determined whether or not the discharge lamp 12 is turned on. If the discharge lamp 12 is turned on, the flow proceeds to a step S41A, whereas if not, the flow proceeds to a step S45. After resetting the failure flags F1, F2 at the step S41A, the step-up circuit 1 and the inverter 4 are controlled at a step S42 to obtain stable lighting of the discharge lamp 12. At a subsequent step S43, it is determined whether or not the light switch 2 is turned off. If the light switch 2 is turned off, the flow proceeds to a step S44, whereas if not, the flow returns to the step S42. At the step S44, operation of the step-up circuit 1 and the inverter 4 is stopped to turn off the discharge lamp 12, finishing lighting control.

If, at the step S41, it is determined that the discharge lamp 12 is not turned on, it is determined at the step S45 whether or not a predetermined period of time elapses. If the predetermined period of time elapses, the flow proceeds to a step S46, whereas if not, the flow returns to the step S36. At the step S46, operation of the step-up circuit 1, the inverter 4, and the starter circuit 6 is stopped, and the flow proceeds to a step S51 as shown in FIG. 10. At the step S51, it is determined whether or not the failure flag F1 is set. If the failure flag F1 is set, the flow proceeds to a step S52, whereas if not, the flow proceeds to a step S53. At the step S52, the failure indicator lamp 16 of the step-up circuit 1 is turned on. At the subsequent step S53, it is determined whether or not the failure flag F2 is set. If the failure flag F2 is set, the flow proceeds to a step S54, whereas if not, the flow proceeds to a step S55. At the step S54, the failure indicator lamp 17 of the inverter 4 and the starter circuit 6 is turned on. At the step S55, since a result of the self-diagnosis fails to reveal detected failure of the above items 1 to 4, and the discharge lamp 12 is not turned on, it is judged that the term of service of the discharge lamp bulb 12b expires and the life thereof comes to an end, and the alarm indicator lamp 18 is turned on for warning the change of the discharge lamp bulb 12b. Subsequently, if, at a step S56, the light switch 2 is turned off, the flow proceeds to a step S57 wherein the failure flags F1, F2 are reset, and the indicators 14 to 18 are turned off, finishing lighting control.

In such a manner, when carrying out the failure diagnosis of the discharge lamp 12 and the lighting device 20, the failure diagnosis is fulfilled in accordance with the predetermined procedure: First, the failure diagnosis of the discharge lamp 12 and the external wiring from the lighting device 20 to the discharge lamp 12 is carried out. If failure such as breakage, disconnection, or imperfect contact is not found, it is diagnosed whether or not output of the lighting device 20 is short-circuited. If output of the lighting device 20 is not short-circuited, it is diagnosed whether or not the step-up circuit 1 operates normally. If the step-up circuit 1 operates normally, the inverter 4 and the starter circuit 6 are actuated to start the discharge lamp 12, and it is diagnosed whether or not the inverter 4 and the starter circuit 6 operate normally. Therefore, a circuit or device as malfunctioned can be detected without any breakage of a normal circuit or device.

In this embodiment, the step-up circuit 1, the inverter 4, and the starter circuit 6 constitute the lighting circuit, whereas the failure detector circuit 13 and the control circuit 11 constitute the failure diagnostic circuit.

Referring next to FIGS. 14 to 18, there is shown a second preferred embodiment of the present invention. The second preferred embodiment is substantially the same as the first preferred embodiment, so that a description will be made principally with regard to the difference from the first preferred embodiment.

Figure 14:
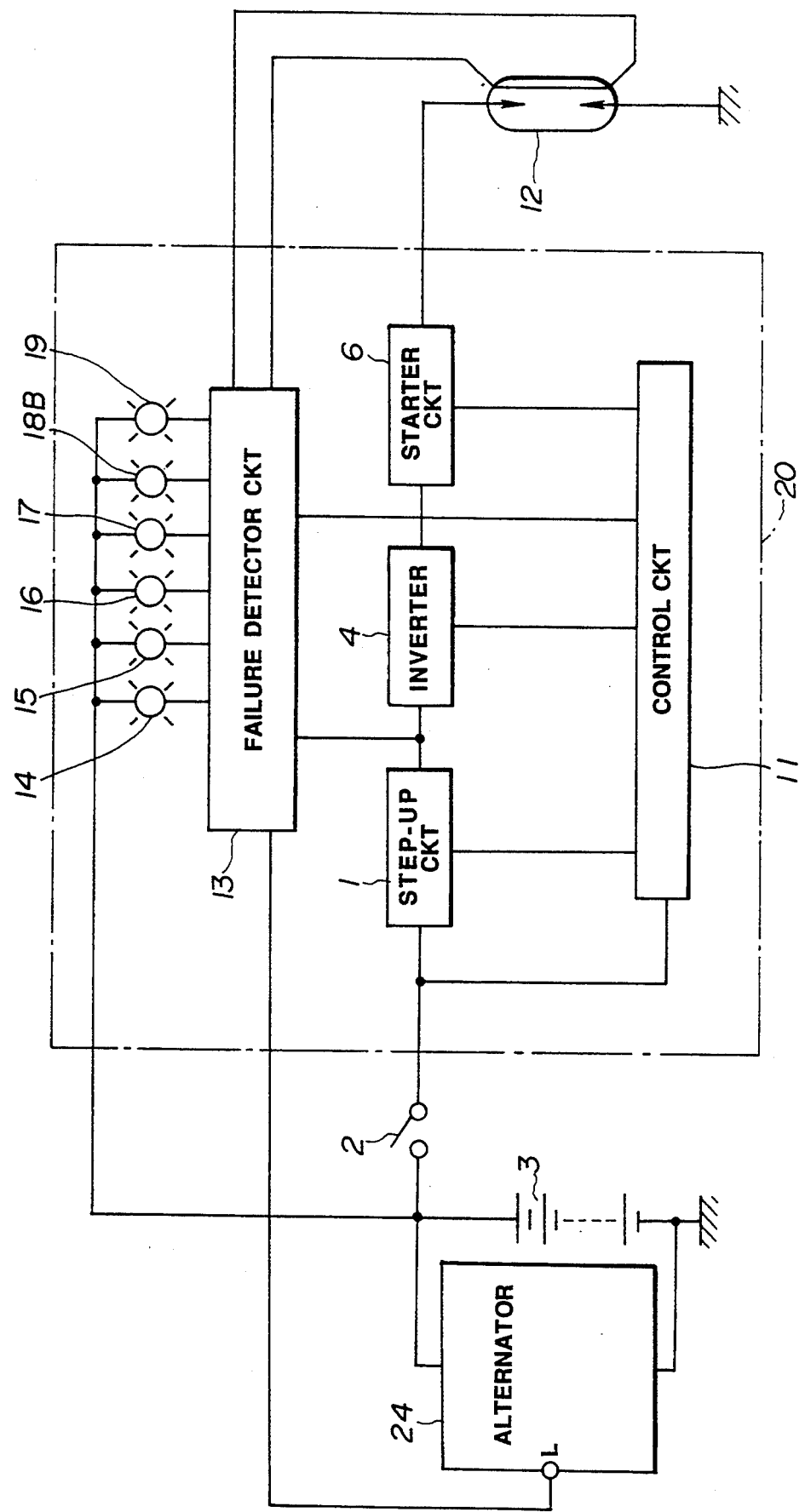
FIG. 14 is a view similar to FIG. 11, showing a second preferred embodiment of a discharge lamp lighting device according to the present invention.
Figure 15:
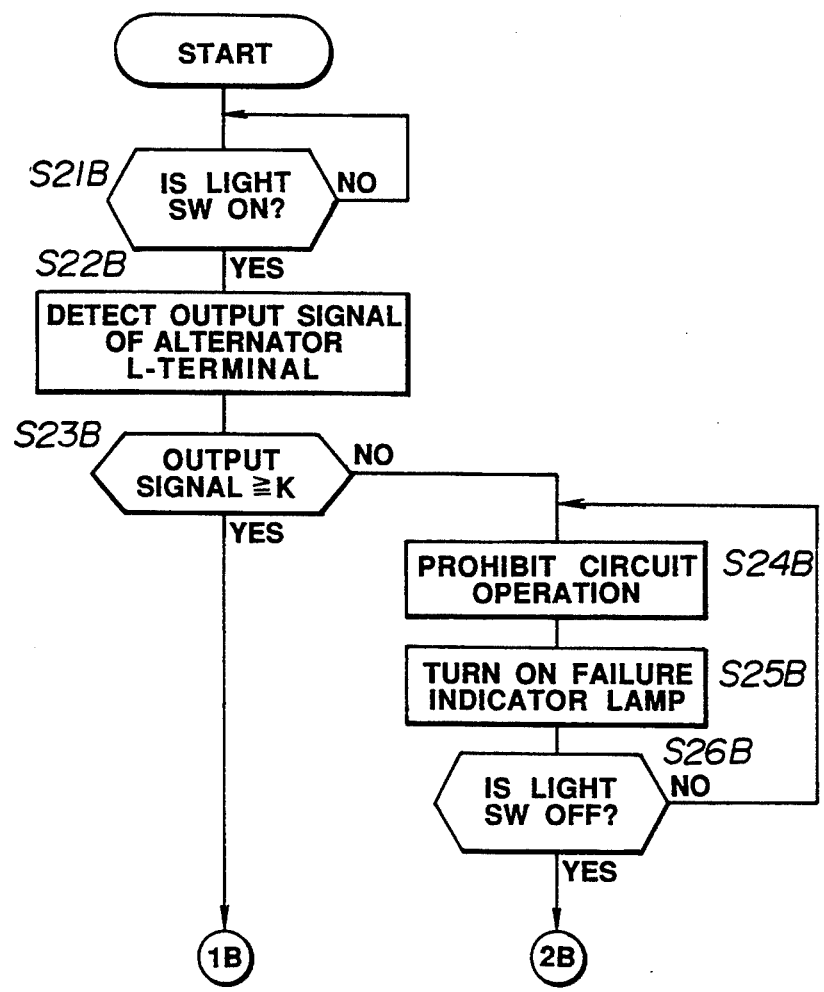
FIG. 15 is a view similar to FIG. 13, showing operation of the second preferred embodiment.

Referring to FIG. 14, an alternator 24 is arranged to be driven by a drive source (not shown) such as an engine for charging the battery 3. An L-terminal of the alternator 24 outputs a signal indicative of a power generating state, and is connected to the failure detector circuit 13. It is to be noted that a failure indicator lamp 18B serves as an indicator lamp for indicating failure of the power source, and a failure indicator lamp 19 serves as an indicator lamp for indicating imperfection of the discharge lamp 12.

In this embodiment, a self-diagnosis of the discharge lamp 12 and the lighting device 20 is carried out upon starting in accordance with the following procedure:
1) The power source of the lighting device 20 is normal?
2) The outer tube of the discharge lamp 12 is not broken? Disconnection of the high voltage cables is not found? Imperfect contact of the connector is not found?
3) Short-circuit failure is not found with output of the lighting device 20?
4) The step-up circuit 1 operate normally?
5) The inverter 4 and the starter circuit 6 operate normally?

Such diagnoses are carried out in the failure detector circuit 13 and the control circuit 11. If some failure is detected, the corresponding failure indicator lamp 14 to 18B is turned on.

Among the above diagnostic items, the item 1 corresponds to a procedure for diagnosing failure of the power source such as a decrease in voltage of the battery 3. The subsequent items 2 and 3 correspond to procedures for diagnosing grave failure which produces even breakage of a normal circuit or device, and enlarges a failure part if the discharge lamp 12 is started. When this grave failure is detected, the diagnoses of the items 4 and 5 are interrupted, and starting of the discharge lamp 12 is prohibited. If a result of the diagnoses of the items 2 and 3 reveals no anomaly, the diagnosis proceeds to the item 4. The item 4 corresponds to a procedure for diagnosing failure of the step-up circuit 1, wherein if output voltage Vdc of the step-up circuit 1 is greater than a specified value, it is determined that the step-up circuit 1 is normal. Even if the output voltage Vdc is smaller than the specified value, the discharge lamp 12 is started since the diagnoses of the items 2 and 3 reveal that no failure is found with the discharge lamp 12 and the external wiring from the lighting device 20 to the discharge lamp 12, and the diagnosis of the next item 5 is carried out. The item 5 corresponds to a procedure for diagnosing failure of the inverter 4 and the starter circuit 6, wherein if the starting voltage Vbd of the inverter 4 and the starter circuit 6 is equal to the specified value, it is determined that the inverter 4 and the starter circuit 6 are normal. Even if the starting voltage Vbd is smaller than the specified value, starting operation is continued since the diagnoses of the items 2 and 3 reveal that no failure is found with the discharge lamp 12 and the external wiring.

First, referring to FIG. 14, the diagnostic procedure of the item 1 will be explained. Ordinarily, even if terminal voltage of the battery 3 is decreased, a lowering of source voltage is compensated by power generated in the alternator 24. Therefore, the failure detector circuit 13 inputs an output signal out of the L-terminal indicative of a power generating state of the alternator 24, and judges that a power generating state of the alternator 24 is normal, i.e., the power source is normal if a level of this output signal is greater than a predetermined value.

Next, referring to FIGS. 3a and 3b, diagnostic circuit and procedure of the item 2 will be explained. The discharge lamp 12 includes the outer tube 12a having the discharge lamp bulb 12b mounted therein, and the inner surface on which the conductive line 12c is vapor-deposited. The starter circuit 6 applies drive voltage to the discharge lamp bulb 12b through the high voltage cable 21, the connector 22, and the high voltage cable 23.

The conductive line 12c of the discharge lamp 12 is connected to the failure detector circuit 13 through the high voltage cable 23, the connector 22, and the high voltage cable 21. Signal current passes from the power source Vcc of the failure detector circuit 13 via a course of resistor R2→signal line 21a→connector 22→signal line 23a→conductive line 12c→signal line 23b→connector 22→signal line 21b→resistor R4→base of the transistor T1→emitter of T1→ground, thus turning on the transistor T1 to put the collector potential V1 thereof at a low level. Now, if there is breakage of the conductive line 12c due to the outer tube 12a of the discharge lamp 12 damaged, or breakage of the high voltage cable 21, 23, or a disconnection of the connector 22, or imperfect contact of the connector 22, the above course becomes unconductive to put the signal current zero, or imperfect contact produces an increase in circuit impedance to decrease signal current. As a result, the transistor T1 becomes off or in a state close to off so as to put the collector potential V1 at a high level. If the collector potential V1 is measured which is greater than the preset value, it is judged that failure is found such as breakage of the discharge lamp 12, breakage of the high voltage cable 21, 23, or imperfect contact or disconnection of the connector 22.

With a presence of such grave failure, starting of the lighting device 20 may produce breakage of a normal circuit or device. Thus, when detecting grave failure, operation of the lighting device 20 is prohibited, and the failure indicator lamp 14 is turned on for warning.

Next, referring to FIG. 2, the diagnostic procedure of the item 3 will be explained. The control circuit 11 supplies the fixed control signal Sg2 to the inverter 4 so as to hold either of the FETs 1, 4 and the FETs 2, 3, for example, the FETs 1, 4, in a on-state, and the PWM control signal Sg1 having low frequency to the step-up circuit 1 so as to output the low DC voltage Vdc. If output of the lighting device 20 such as the bulb 12b of the discharge lamp 12 or the high voltage cable 21, 23 is short-circuited, current passes under the DC output voltage Vdc of the step-up circuit 1 via a course of FET 1→secondary winding of the transformer TR1→discharge lamp 12→FET 4→resistor 5, thus generating voltage proportional to current passing at the one terminal A of the resistor 5. By this, short-circuit failure of output of the lighting device 20 is detected.

With a presence of such grave failure, operation of the lighting device 20 may produce breakage of a normal circuit or device. Thus, when detecting grave failure, operation of the lighting device 20 is prohibited, and the failure indicator lamp 15 is turned on for warning.

Referring also to FIG. 2, the diagnostic procedure of the item 4 will be explained. Since a result of the diagnosis of the item 3 confirms that output of the lighting device 20 is not short-circuited, the control circuit 11 supplies the ordinary PWM control signal Sg1 to the step-up circuit 1 so as to actuate the step-up circuit 1, and it is examined whether or not the output DC voltage Vdc is greater than the specified value. If the DC output voltage Vdc is greater than the specified value, it is judged that the step-up circuit 1 operates normally.

As described above, even if the output voltage Vc is smaller than the specified value, the procedure of the next item 5 is carried out since the procedures of the items 2 and 3 reveal that no failure is found with the discharge lamp 12 and the external wiring.

Finally, the diagnostic procedure of the item 5 will be explained. As described above, if the starting voltage Vbd is greater than the specified value, it is judged that the inverter 4 and the starter circuit 6 are normal. However, in this embodiment, the inverter 4 and the starter circuit 6 are diagnosed in the following method since the starting voltage Vbd is difficult to measure due to a high value of, for example, 10 kV to 20 kV, and an addition of a circuit for measuring such high voltage may have a harmful influence on a load:

Referring to FIGS. 4 and 5, as described above, the starter circuit 6 generates pulse-train-like current in the primary winding circuit of the transformer TR1, and introduces pulse-train-like voltage on the secondary side of the transformer TR1, which is superimposed on the DC voltage Vdc, thus generating the starting voltage Vbd. Therefore, if pulse-train-like current having a specified value passes in the primary winding circuit of the transformer TR1, it can be estimated that the starting voltage Vbd is greater than the specified value.

During a starting period of the discharge lamp 12, the gate signal Vg1 is applied to the capacitor C4 of the starter circuit 6 through the diode D2 for charging same. The pulse-train-like control signal Sg3 is supplied to the gate of the FET 5. Whenever the FET 5 is on, an electric charge accumulated in the capacitor C4 is discharged, so that the current Io passes in the primary winding of the transformer TR1 at a period of the control signal Sg3, and high voltage pulse voltage, i.e., the starting voltage Vbd, is generated in the secondary winding of the transformer TR1 at the same period. This starting voltage Vbd is proportional to the primary winding current Io of the transformer TR1, and has a higher value as the current Io becomes greater. Additionally, the primary winding current Io is proportional to the terminal voltage Vchg of the capacitor C4, and has a greater value as the terminal voltage Vchg becomes higher. That is, since the starting voltage Vbd is proportional to the terminal voltage Vchg of the capacitor C4, the starting voltage Vbd can be estimated by detecting the terminal voltage Vchg.

The control circuit 11 also supplies the pulse-train-like control signal Sg3 to a base of the transistor T2 through a resistor R9, so that the transistor T2 is on at a period of the control signal Sg3. Voltage obtained by dividing the terminal voltage Vchg of the capacitor C4 between the resistors R6 and R7 is applied to a collector of the transistor T2. Whenever the transistor T2 is on, this divided voltage is applied to the capacitor C5 through a resistor R5 for charging same. As a result, a terminal voltage V2 of the capacitor C5 increases at a period of the pulse-train-like signal, and augments more quickly as the terminal voltage Vchg of the capacitor C4 becomes higher. In this embodiment, the control circuit 11 supplies three pulse control signals Sg3. The terminal voltage V2 is detected immediately after occurrence of three starting voltage pulses Vbd. If the voltage V2 is greater than a predetermined threshold value, it is judged that the normal starting voltage Vbd is applied to the discharge lamp 12, and the inverter 4 and the starting circuit 6 operate normally.

Referring to FIGS. 15 to 18, operation of this embodiment will be explained.

Figure 16:
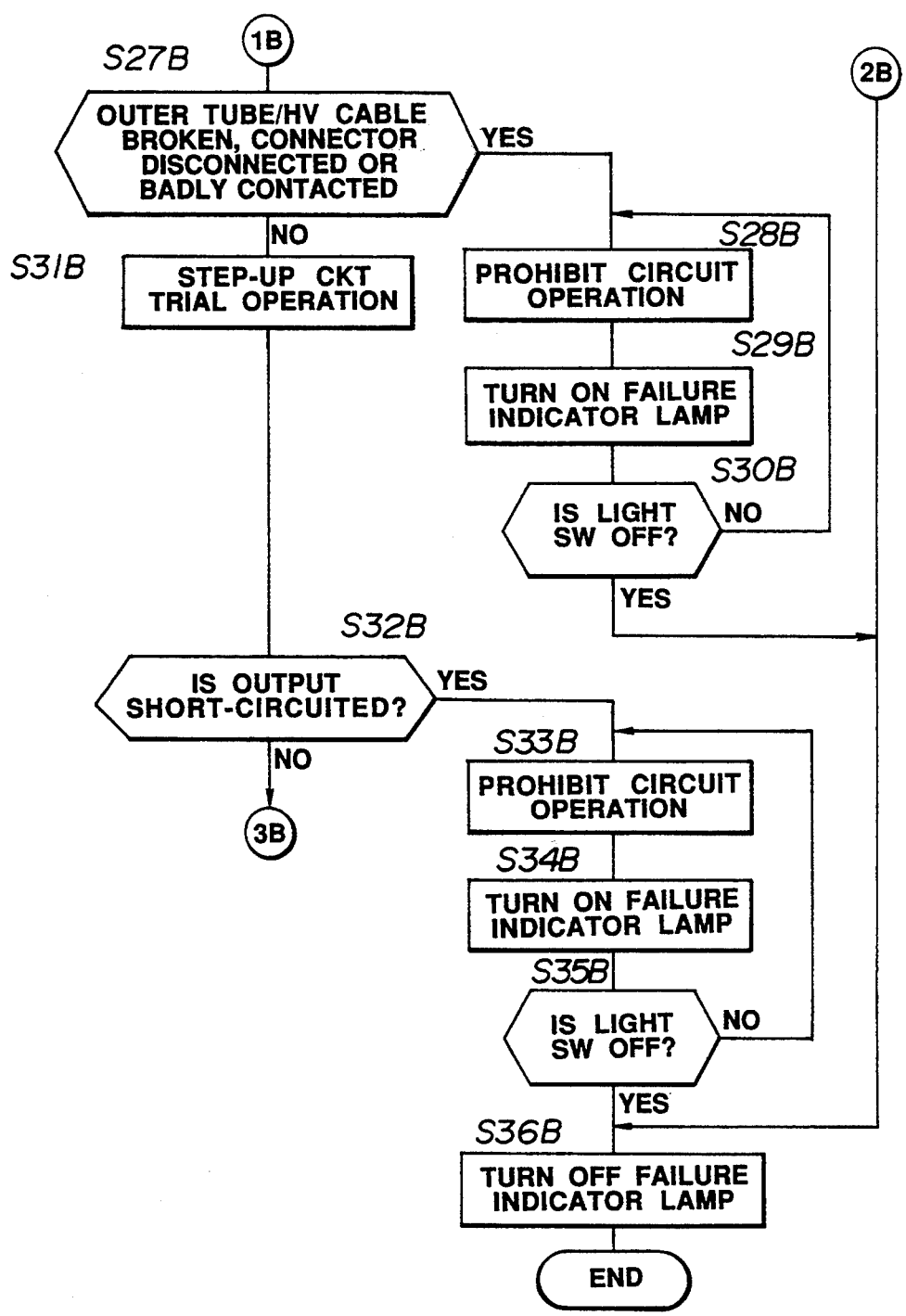
FIG. 16 is a view similar to FIG. 15, showing operation subsequent to FIG. 15.

At a step S21B, it is determined whether or not the light switch 2 is turned on. If the light switch 2 is turned on, the flow proceeds to a step S22B wherein an output signal out of the L-terminal of the alternator 24 is detected by the failure detector circuit 13. At a subsequent step S23B, it is determined whether or not a level of the output signal out of the L-terminal of the alternator 24 is greater than a predetermined value K. If the level of the output signal is greater than the predetermined value K, it is judged that the power source is normal, and the flow proceeds to a step S27B as shown in FIG. 16, whereas if not, the flow proceeds to a step S24B. At the step S24B, operation of the step-up circuit 1, the inverter 4, and the starter circuit 6 is prohibited, then the flow proceeds to a step S25B wherein the failure indicator lamp 18B is turned on for warning. Subsequently, at a step S26B, it is determined whether or not the light switch 2 is turned off. If the light switch 2 is turned off, the flow proceeds to a step S36B as shown in FIG. 16, whereas if not, the flow returns to the step S24B. At the step S36B as shown in FIG. 16, the failure indicator lamp 18B is turned off, finishing lighting control of the discharge lamp 12.

At the step S27B, it is determined by the failure detector circuit 13 whether or not breakage of the outer tube 12a of the discharge lamp 12, breakage of the high voltage cables 21, 23, or disconnection or imperfect contact of the connector 22 is found. As described above, if the voltage V1 of the failure detector circuit 13 as shown in FIG. 3a exceeds the preset value, it is judged that some failure is found, and the flow proceeds to a step S28B, whereas if not, the flow proceeds to a step S31B. When such grave failure is detected, operation of the step-up circuit 1, the inverter 4, and the starter circuit 6 is prohibited at the step S28B, then the flow proceeds to a step S29B wherein the failure indicator lamp 14 is turned on for warning. Subsequently, at a step S30B, it is determined whether or not the light switch 2 is turned off. If the light switch 2 is turned off, the flow proceeds to the step S36B, whereas if not, the flow returns to the step S28B. At the step S36B, the failure indicator lamp 14 is turned off, finishing lighting control of the discharge lamp 12.

If it is determined at the step S27B that no failure is found with the discharge lamp 12 and the external wiring, at the step S31B, the control circuit 11 outputs the PWM control signal Sg1 having low frequency to the step-up circuit 1, and the step-up circuit 1 outputs the low DC voltage Vdc for carrying out trial operation. At a subsequent step S32B, it is determined whether or not output of the lighting device 20 is short-circuited. As described above, if voltage is generated at the one terminal A of the resistor R5 as shown in FIG. 2, it is judged that a short-circuit is found with output of the lighting device 20, and the flow proceeds to a step S33B. Since a short-circuit of output of the lighting device 20 is grave failure, operation of the step-up circuit 1, the inverter 4, and the starter circuit 6 is prohibited at the step S33B. At a subsequent step S34B, the failure indicator lamp 15 is turned on. Subsequently, at a step S35B, it is determined whether or not the light switch 2 is turned off. If the light switch 2 is turned off, the flow proceeds to the step S36B, whereas if not, the flow returns to the step S33B. At the step S36B, the failure indicator lamp 15 is turned off, finishing lighting control of the discharge lamp 12.

Figure 17:
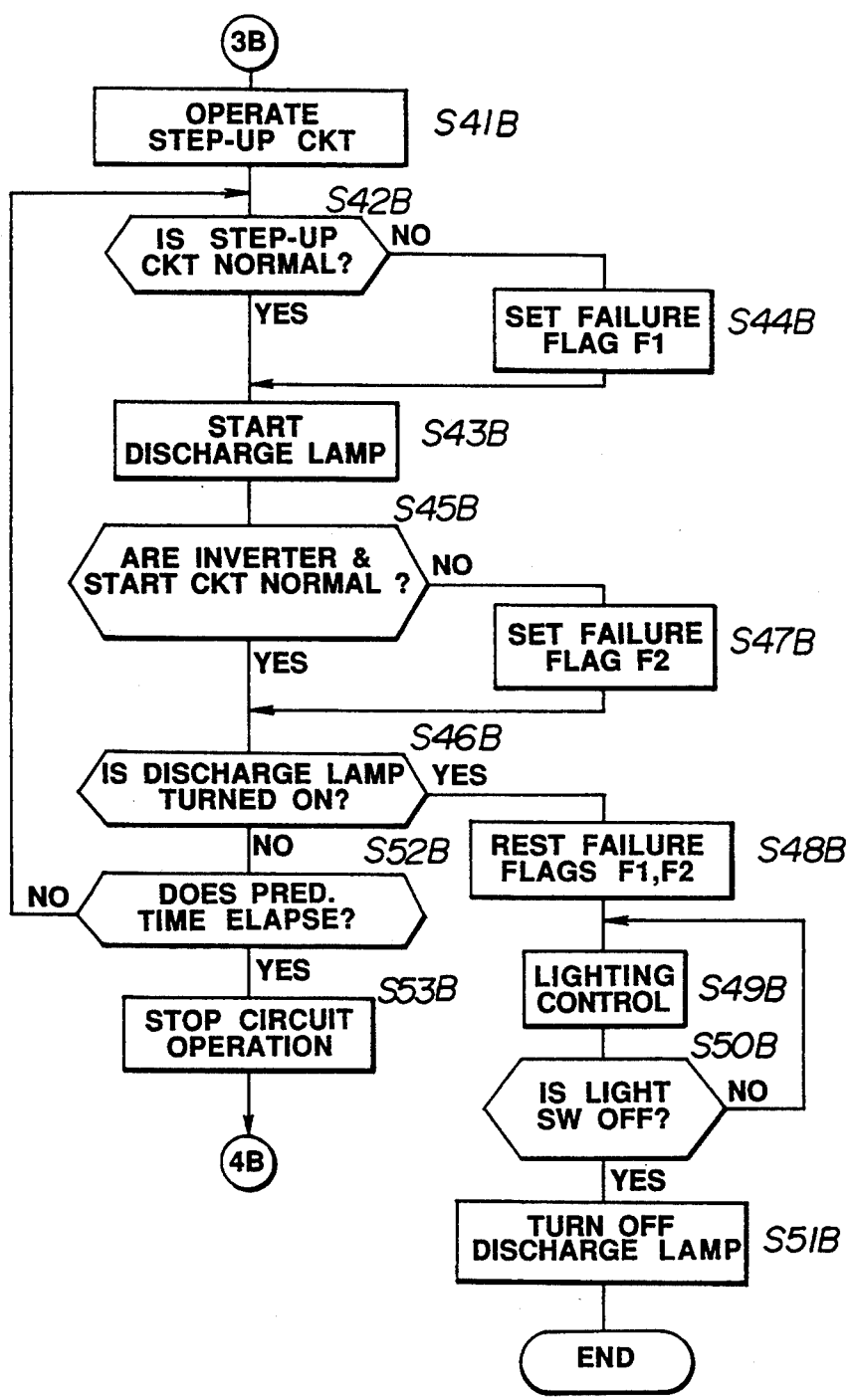
FIG. 17 is a view similar to FIG. 16, showing operation subsequent to FIG. 16.

If it is determined at the step S32B that no short-circuit is found with output of the lighting device 20, the flow proceeds to a step S41B as shown in FIG. 17 wherein the control circuit 11 outputs the ordinary PWM signal Sg1 to the step-up circuit 1 so as to make the step-up circuit 1 carry out ordinary step-up operation. At a subsequent step S42B, it is determined whether or not the step-up circuit 1 is normal. If the output voltage Vdc of the step-up circuit 1 is greater than the specified value, it is judged that the step-up circuit 1 is normal, and the flow proceeds to a step S43B, whereas if not, the flow proceeds to a step S44B wherein the failure flag F1 of the step-up circuit 1 is set.

Even if it is judged that failure is found due to the output voltage Vdc of the step-up circuit 1 being smaller than the specified value, the inverter 4 and the starter circuit 6 are actuated at the step S43B to start the discharge lamp 12 since it is confirmed that the power source is normal, and no anomaly is found with the discharge lamp 12 and the external wiring. At a step S45B, it is determined whether or not the inverter 4 and the starter circuit 6 are normal. As described above, if the terminal voltage V2 of the capacitor C5 of the starter circuit 6 as shown in FIG. 4 exceeds the threshold value, or the terminal voltage V3 of the capacitor C6 of the starter circuit 6A as shown in FIG. 6 exceeds the threshold value, it is judged that the inverter 4 and the starter circuit 6 are normal, and the flow proceeds to a step S46B, whereas if not, the flow proceeds to a step S47B. At the step S47B, the failure flag F2 of the inverter 4 and the starter circuit 6 is set.

At the step S46B, it is determined whether or not the discharge lamp 12 is turned on. If the discharge lamp 12 is turned on, the flow proceeds to a step S48B, whereas if not, the flow proceeds to a step S52B. For judging a on-off state of the discharge lamp 12, a resistor or a capacitor is connected in series to the discharge lamp 12, and a current passing through the discharge lamp 12 is detected by measuring voltage across both ends thereof, thus determining turning-on and turning-off of the discharge lamp 5 based on a value of detected current. After resetting the failure flags F1, F2 at the step S48B, the step-up circuit 1 and the inverter 4 are controlled at a step S49B to obtain stable lighting of the discharge lamp 12. At a subsequent step S50B, it is determined whether or not the light switch 2 is turned off. If the light switch 2 is turned off, the flow proceeds to a step S51B, whereas if not, the flow returns to the step S49B. At the step S51B, operation of the step-up circuit 1 and the inverter 4 is stopped to turn off the discharge lamp 12, finishing lighting control.

Figure 18:
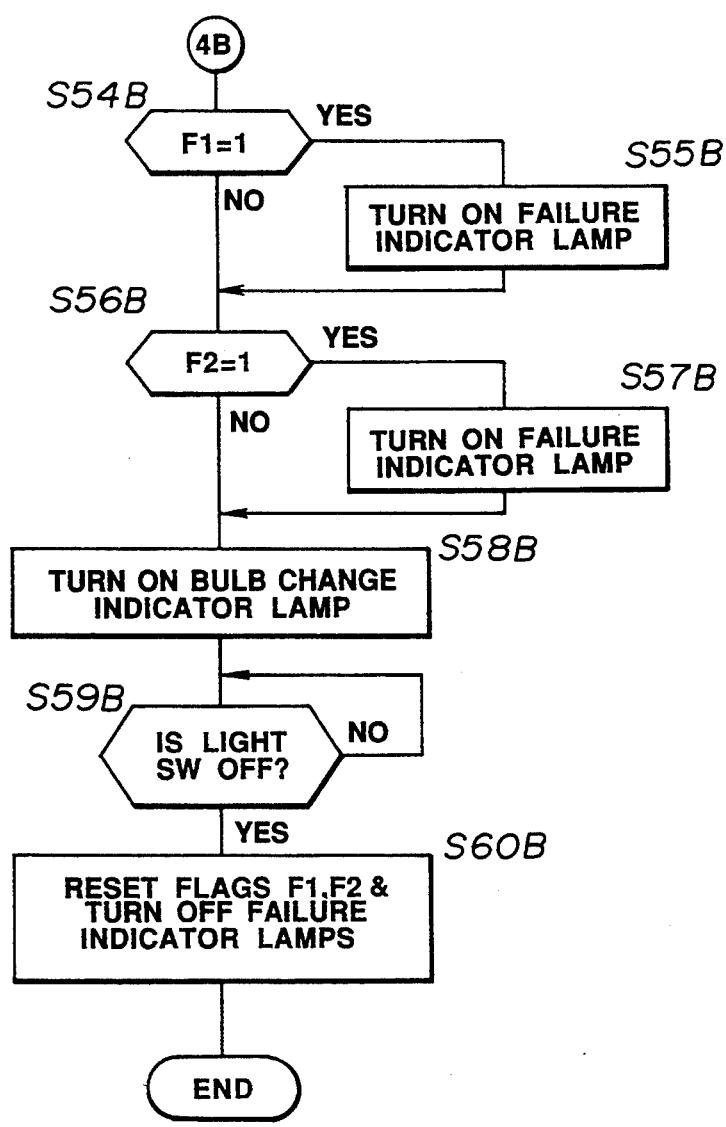
FIG. 18 is a view similar to FIG. 17, showing operation subsequent to FIG. 17.

If, at the step S46B, it is determined that the discharge lamp 12 is not turned on, it is determined at the step S52B whether or not a predetermined period of time elapses. If the predetermined period of time elapses, the flow proceeds to a step S53B, whereas if not, the flow returns to the step S42B. At the step S53B, operation of the step-up circuit 1, the inverter 4, and the starter circuit 6 is stopped, and the flow proceeds to a step S54B as shown in FIG. 18. At the step S54B as shown in FIG. 18, it is determined whether or not the failure flag F1 is set. If the failure flag F1 is set, the flow proceeds to a step S55B, whereas if not, the flow proceeds to a step S56B. At the step S55B, the failure indicator lamp 16 of the step-up circuit 1 is turned on. At the subsequent step S56B, it is determined whether or not the failure flag F2 is set. If the failure flag F2 is set, the flow proceeds to a step S57B, whereas if not, the flow proceeds to a step S58B. At the step S57B, the failure indicator lamp 17 of the inverter 4 and the starter circuit 6 is turned on. At the step S58B, since a result of the self-diagnosis fails to reveal detected failure of the items 1 to 5, and the discharge lamp 12 is not turned on, it is judged that the discharge lamp bulb 12b is defective, and the failure indicator lamp 19 is turned on for warning the change of the discharge lamp bulb 12b. Subsequently, if, at a step S59, the light switch 2 is turned off, the flow proceeds to a step S60B wherein the failure flags F1, F2 are reset, and the indicator lamps 14 to 19 are turned off, finishing lighting control.

In such a manner, when carrying out the failure diagnosis of the discharge lamp 12 and the lighting device 20, the failure diagnosis is fulfilled in accordance with the predetermined procedure: First, the failure diagnosis of the power source is carried out based on the output signal out of the L-terminal of the alternator 24. If the power source is normal, the failure diagnosis of the discharge lamp 12 and the external wiring from the lighting device 20 to the discharge lamp 12 is carried out. A result of the diagnosis reveals no failure such as breakage, disconnection, or imperfect contact, it is diagnosed whether or not output of the lighting device 20 is short-circuited. If output of the lighting device 20 is not short-circuited, it is diagnosed whether or not the step-up circuit 1 operates normally. If the step-up circuit 1 operates normally, the discharge lamp 12 is started by actuating the inverter 4 and the starter circuit 6, and it is diagnosed whether or not the inverter 4 and the starter circuit 6 operate normally. If the discharge lamp 12 is not turned on though the above diagnostic results are all normal, it is judged that the discharge lamp bulb 12b is defective, and the failure indicator lamp 19 is turned on. Thus, when the discharge lamp 12 is turned off though an outside appearance thereof, the external wiring, and the lighting circuit are all normal, it can be quickly and exactly judged whether it is due to failure of the power source or imperfection of the discharge lamp bulb 12b. Therefore, turning-off accident of the discharge lamp 12 can be restored in a short period of time. Moreover, a circuit or device as malfunctioned can be detected without any breakage of a normal circuit or device.

In this embodiment, the battery 3 and the alternator 24 constitute power source, and the step-up circuit 1, the inverter 4 and the starter circuit 6 constitute the lighting circuit, and the failure detector circuit 13 and the control circuit 11 constitute the failure diagnostic circuit.

Having described the present invention in connection with the preferred embodiments, it is to be noted that the lighting circuit and the failure diagnostic circuit are not limited thereto.

What is claimed is:

1. A system for lighting a discharge lamp with a bulb and a conductive line separated from said bulb, the discharge lamp being connected to a power source, comprising:
    a lighting circuit means for lighting the discharge lamp, said lighting circuit means being connected to the bulb of the discharge lamp through an external wiring with a signal line; and
    a failure diagnostic circuit means, connected to the conductive line of the discharge lamp through said signal line of said external wiring and said lighting circuit means, for diagnosing failure of the discharge lamp and failure of said lighting circuit means,
    said failure diagnostic circuit means diagnosing failure of the discharge lamp and failure of said external wiring,
    said failure diagnostic circuit means diagnosing failure of said lighting circuit means only if both of failure of the discharge lamp and failure of said external wiring fail to be found;
    said failure diagnostic circuit means diagnosing failure of the bulb only if failure of the lighting circuit means fails to be found.

2. A system as claimed in claim 1, wherein said failure diagnostic circuit means diagnoses a breakage of the discharge lamp and a disconnection of said external wiring,
    said failure diagnostic circuit means diagnoses whether or not an output of said lighting circuit means is short-circuited if said breakage of the discharge lamp and said disconnection of said external wiring fail to be found, and
    said failure diagnostic circuit means diagnoses said lighting circuit means which is actuated if said output of said lighting circuit fails to be short-circuited.

3. A system as claimed in claim 2, wherein said failure diagnostic circuit means diagnoses the power source,
    said failure diagnostic circuit means diagnoses said breakage of the discharge lamp and said disconnection of said external wiring if the power source is normal,
    said failure diagnostic circuit means diagnoses said lighting circuit means if said breakage of the discharge lamp and said disconnection of said external wiring fail to be found, and
    said failure diagnostic circuit means diagnoses that the bulb of the discharge lamp is defective if the discharge lamp fails to be turned on though said lighting circuit means is normal.

4. A system as claimed in claim 3, wherein said lighting circuit means includes a step-up circuit, an inverter and a starter circuit, whereas said failure diagnostic circuit means includes a failure detector circuit and a control circuit.

5. A method of lighting a discharge lamp with a bulb, the discharge lamp being connected to a power source, a lighting circuit means connected to the bulb of the discharge lamp through an external wiring with a signal line for lighting the discharge lamp, and a failure diagnostic circuit means for diagnosing failure of the discharge lamp and the lighting circuit means, the method comprising the steps of:
    diagnosing failure of the discharge lamp and failure of the external wiring; and
    diagnosing failure of the lighting circuit means only if both of failure of the discharge lamp and failure of the external wiring fail to be found;
    diagnosing failure of the bulb only if failure of the lighting circuit means fails to be found.

6. A method as claimed in claim 5, further comprising the steps of:
    diagnosing a breakage of the discharge lamp and a disconnection of the external wiring:

diagnosing whether or not an output of the lighting circuit means is short-circuited if said breakage of the discharge lamp and said disconnection of the external wiring fail to be found; and diagnosing the bulb of the discharge lamp which is actuated if said output of the lighting circuit means fails to be short-circuited.

7. A method as claimed in claim 6, further comprising the steps of:

diagnosing the power source;

diagnosing said breakage of the discharge lamp and said disconnection of the external wiring if the power source is normal;

diagnosing the lighting circuit means if said breakage of the discharge lamp and said disconnection of the external wiring fail to be found; and diagnosing that the bulb of the discharge lamp is defective if the discharge lamp fails to be turned on though the lighting circuit means is normal.

8. A method as claimed in claim 7, wherein said step of diagnosing the power source is carried out based on a signal derived from an L-terminal of an alternator.

* * * * *